United States Patent
Gavagnin et al.

(10) Patent No.: US 10,790,234 B2
(45) Date of Patent: Sep. 29, 2020

(54) EMBEDDING KNOWN-GOOD COMPONENT IN KNOWN-GOOD CAVITY OF KNOWN-GOOD COMPONENT CARRIER MATERIAL WITH PRE-FORMED ELECTRIC CONNECTION STRUCTURE

(71) Applicant: AT&S Austria Technologie & Systemtechnik Aktiengesellschaft, Leoben (AT)

(72) Inventors: Marco Gavagnin, Leoben (AT); Markus Leitgeb, Trofaiach (AT); Martin Schrems, Eggersdorf (AT); Roland Winkler, Semriach (AT); Steve Anderson, Leoben (AT)

(73) Assignee: AT&S Austria Technologie & Systemtechnik Aktiengesellschaft, Leoben (AT)

(*) Notice: Subject to any disclaimer, the term of this patent is extended or adjusted under 35 U.S.C. 154(b) by 0 days.

(21) Appl. No.: 16/185,283

(22) Filed: Nov. 9, 2018

(65) Prior Publication Data
US 2019/0148304 A1 May 16, 2019

(30) Foreign Application Priority Data
Nov. 11, 2017 (EP) .................... 17201225

(51) Int. Cl.
*H01L 23/538* (2006.01)
*H01L 23/13* (2006.01)
(Continued)

(52) U.S. Cl.
CPC ...... *H01L 23/5389* (2013.01); *H01L 21/4853* (2013.01); *H01L 21/561* (2013.01); *H01L 21/6835* (2013.01); *H01L 22/14* (2013.01); *H01L 22/20* (2013.01); *H01L 23/13* (2013.01); *H01L 23/367* (2013.01); *H01L 23/49811* (2013.01); *H01L 23/5386* (2013.01); *H01L 24/97* (2013.01); *H01L 21/486* (2013.01); *H01L 22/12* (2013.01); *H01L 23/5384* (2013.01); *H01L 2221/68345* (2013.01); *H01L 2221/68359* (2013.01); *H01L 2224/95001* (2013.01)

(58) Field of Classification Search
CPC . H01L 23/13; H01L 23/367; H01L 23/49811; H01L 23/5386; H01L 23/5389
See application file for complete search history.

(56) References Cited

U.S. PATENT DOCUMENTS 7,727,802 B2 6/2010 Sunohara et al.
8,431,438 B2 4/2013 Nalla et al.
(Continued)

FOREIGN PATENT DOCUMENTS

EP          1 734 581 A1    12/2006
WO   WO 2017/046762 A1    3/2017
(Continued)

*Primary Examiner* — Peniel M Gumedzoe
(74) *Attorney, Agent, or Firm* — Robert A. Blaha; Smith Tempel Blaha LLC

(57) ABSTRACT

A method of manufacturing a component carrier includes providing a known-good layer stack comprising an already formed electrically conductive connection structure and a known-good cavity, and mounting a known-good component on the already formed electrically conductive connection structure in the cavity.

10 Claims, 10 Drawing Sheets

(51) Int. Cl.
   *H01L 23/498* (2006.01)
   *H01L 23/367* (2006.01)
   *H01L 21/66* (2006.01)
   *H01L 21/56* (2006.01)
   *H01L 21/48* (2006.01)
   *H01L 23/00* (2006.01)
   *H01L 21/683* (2006.01)

(56) References Cited

U.S. PATENT DOCUMENTS

| | | |
|---|---|---|
| 9,338,891 B2 | 5/2016 | Shimabe et al. |
| 9,443,839 B2 | 9/2016 | Lotfi et al. |
| 9,516,740 B2 | 12/2016 | Lee et al. |
| 2008/0117607 A1* | 5/2008 | Murayama ......... H01L 21/4846 361/760 |
| 2009/0267171 A1* | 10/2009 | Yean ....................... H01L 23/13 257/434 |
| 2009/0309212 A1 | 12/2009 | Shim et al. |
| 2011/0018123 A1 | 1/2011 | An et al. |
| 2013/0147041 A1 | 6/2013 | Chan et al. |
| 2013/0249101 A1 | 9/2013 | Lin et al. |
| 2015/0008566 A1* | 1/2015 | Gerber ................... H01L 24/97 257/668 |
| 2015/0262928 A1* | 9/2015 | Shen ..................... H01L 23/315 257/676 |
| 2016/0044789 A1 | 2/2016 | Shimizu et al. |
| 2016/0086894 A1 | 3/2016 | Rorane et al. |
| 2016/0118332 A1 | 4/2016 | Lin |
| 2016/0118333 A1 | 4/2016 | Lin |
| 2016/0219712 A1 | 7/2016 | Ko et al. |
| 2016/0316566 A1 | 10/2016 | Sakai et al. |
| 2016/0322295 A1 | 11/2016 | Kobayashi et al. |

FOREIGN PATENT DOCUMENTS

| | | |
|---|---|---|
| WO | WO 2017/046764 A1 | 3/2017 |
| WO | WO 2017/046765 A1 | 3/2017 |
| WO | WO 2017/093907 A1 | 6/2017 |

* cited by examiner

EMBEDDING KNOWN-GOOD COMPONENT IN KNOWN-GOOD CAVITY OF KNOWN-GOOD COMPONENT CARRIER MATERIAL WITH PRE-FORMED ELECTRIC CONNECTION STRUCTURE

TECHNICAL FIELD

The invention relates to a method of manufacturing a component carrier, to a method of manufacturing a system, to component carriers, and to a system.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with ever smaller spacing between these contacts. Removal of heat generated by such electronic components and the component carrier itself during operation also becomes an increasing issue. At the same time, component carriers shall be mechanically robust and electrically reliable so as to be operable even under harsh conditions.

Moreover, efficiently and reliably embedding a component in a component carrier is an issue. This is in particular important when valuable components, such as a microprocessor chip, are to be connected electrically with other constituents of a component carrier.

SUMMARY

There may be a need to reliably embed a component in a component carrier.

A method of manufacturing a component carrier, a method of manufacturing a system, a component carrier, and a system according to the independent claims are provided.

According to an exemplary embodiment of the invention, a method of manufacturing a component carrier is provided, wherein the method comprises providing a known-good layer stack comprising an already formed electrically conductive connection structure and a known-good cavity, and mounting a known-good component on the already (i.e. previously) formed electrically conductive connection structure in the cavity.

According to another exemplary embodiment of the invention, a method of manufacturing a system is provided, wherein the method comprises manufacturing a plurality of component carriers by a method as described above, testing as to whether the individual component carriers meet at least one predefined quality criterion, so that the respective component carrier is classified as known-good component carrier (if the respective component carrier fulfils the at least one predefined quality criterion), or is not classified as known-good component carrier (if the respective component carrier does not fulfil the at least one predefined quality criterion), and assembling, in particular stacking, a plurality of component carriers which have been classified as known-good component carriers to form the system.

According to another exemplary embodiment of the invention, a component carrier is provided, wherein the component carrier comprises a known-good layer stack comprising an already formed or pre-formed electrically conductive connection structure and a known-good cavity, and a known-good component mounted on the already formed or pre-formed electrically conductive connection structure in the cavity.

According to another exemplary embodiment of the invention, a component carrier is provided, wherein the component carrier comprises a known-good layer stack comprising a pre-formed electrically conductive connection structure with embedded components and a known-good cavity, and a known-good component mounted in the cavity on the pre-formed electrically conductive connection structure with pre-embedded components.

According to yet another exemplary embodiment of the invention, a method of manufacturing a component carrier is provided, wherein the method comprises providing a known-good layer stack comprising a pre-formed electrically conductive connection structure with embedded components and a known-good cavity, and mounting a known-good component in the cavity on the pre-formed electrically conductive connection structure with pre-embedded components.

According to still another exemplary embodiment of the invention, a system is provided which comprises a plurality of (in particular assembled) known-good component carriers having the above-mentioned features.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. Such a component carrier may comprise organic material, glass, mold materials, etc. A component carrier may also be a hybrid board combining different ones of the above mentioned types of component carriers.

In the context of the present application, the term "known-good" may particularly denote that a structure (such as a layer stack, a cavity, a component or a component carrier) being considered for manufacturing a component carrier or a system of multiple component carriers has already previously, i.e. before using, mounting or assembling the respective constituent, been successfully tested concerning its qualification to contribute to the formation of a failure-free component carrier or system and has therefore successfully passed such a test. In particular, such a test may be a quality test testing this qualification. The quality test may test as to whether the respective structure fulfills a predefined specification, is within a predefined range of tolerances, and/or complies with a predefined functional requirement. Such a quality test may be an electric test which may for instance involve applying an electric stimulus signal and measuring an electric response signal which must fulfill certain conditions in order to consider the respective structure to have passed the test. Such a test may, additionally or alternatively, be also an inspection (for instance an optical inspection) measuring shape and/or dimension of a respective structure as at least part of the test. In an embodiment, only if an individually tested structure has passed the test, is it classified as "known-good" structure, whereas it can be classified as "not known-good" if the structure fails to pass the test.

Upon failing such a test, the respective structure may for instance be disposed as waste, or may be made subject to a repair or post-processing procedure or may be used for another purpose.

In the context of the present application, the term "layer stack" may particularly denote a stack of multiple planar layer structures being connected to one another. In particular, such layer structures may be electrically insulating layer structures and/or electrically conductive layer structures. The term "layer structure" may particularly denote one of a continuous layer, a patterned layer and an arrangement of multiple connected and/or non-connected islands within one plane. For instance, such a layer structure may be a continuous foil or sheet, whereas such a foil or sheet may also be patterned. The layer structures or the stack as a whole may comprise component carrier material, i.e. material used for electrically conductive structures or electrically insulating structures of a component carrier such as a printed circuit board or an IC substrate. The individual layer structures of the stack may be connected in particular by lamination, i.e. the application of heat and/or pressure.

In the context of the present application, the term "electrically conductive connection structure" may particularly denote any two- or three-dimensional arrangement of electrically conductive bodies forming part of the layer stack and being configured for providing an electric coupling of the component with other portions of the component carrier and/or with an electronic environment. Such electrically conductive contact structures may be composed of one or more patterned electrically conductive layers (such as a patterned seed layer), vertical interconnect structures (such as copper filled laser vias or copper filled mechanically drilled holes), etc.

In the context of the present application, the term "component" may particularly denote any part or item, in particular having an electronic and/or thermal and/or mechanical function, being embedded in or surface-mounted on the layer stack or component carrier. In particular, the component may be of a non-layer type, i.e. may not be as flat as the layer structures forming the stack. For instance, the component may extend vertically over multiple layer structures of the stack. In embodiments, the component may be made of a material at least partially deviating from component carrier material. For example, the component may be a semiconductor chip.

According to an exemplary embodiment of the invention, a manufacturing architecture for manufacturing a component carrier is provided in which a component carrier with embedded component is formed using a known-good layer stack, a known-good cavity formed in the layer stack and a known-good component to be placed in the cavity. By combining individually pre-tested known-good structures during manufacture of the component carrier or system, it can be ensured that the manufactured component carrier or system reliably meets predefined quality criteria and is compliant with a certain specification for a component carrier being manufactured. This is in particular advantageous when complex and/or valuable and/or not easily available constituents of a component carrier are combined during the manufacture of the component carrier. For instance, the component may be a microprocessor to form a component carrier with integrated embedded microprocessor function. If one of the layer stack, the component itself and a cavity being used for accommodating the microprocessor should not meet certain quality requirements, the readily manufactured component carrier would have to be classified as waste and the remaining, for instance good, structures thereof would be lost or unusable. This would result in a significant loss of hardware and manufacturing resources. By ensuring that the combined structures are all known-good as a result of a corresponding test carried out prior to the assembly of the respective structure during the manufacturing process of the component carrier, resources may be used efficiently.

Highly advantageously, an electrically conductive connection structure electrically connecting the embedded component within the component carrier or system and/or with an exterior of the component carrier or system may be already pre-formed (i.e. its formation may be already completed) at the time of mounting the component in the cavity. This has the particular advantage that it increases the freedom of design for a component carrier designer. Moreover, pre-manufacturing the electrically conductive contact structure as part of the layer stack may also allow ensuring—in view of the test carried out with the layer stack—that also the electrically conductive contact structure can be considered as known-good contact structure. By mounting the component on the layer stack in the cavity, an electrically conductive connection between electrically conductive contacts (such as pads) of the component on the one hand and the electrically conductive contact structure on the other hand may be established by the mounting procedure only without the need of additional effort.

In the following, further exemplary embodiments of the methods, the component carriers, and the system will be explained.

In an embodiment, the method comprises providing a further known-good layer stack on top of the known-good layer stack with an embedded component, wherein the further layer stack comprises a further already formed electrically conductive connection structure and optionally a further known-good cavity (alternatively, it is possible to assemble on top only a further known-good layer stack), and mounting a further known-good component on the further already formed electrically conductive connection structure in the further cavity. By taking this measure, a three-dimensional integration of multiple component carrier type constituents or modules may be established. Since the constituents of both or all (in particular at least three) of such devices may be all known-good constituents, it can be ensured that the manufactured system properly works and the yield is high. The amount of devices which need to be classified—as a whole—as waste can thereby be significantly reduced. This improves the efficiency of the use of resources.

In an embodiment, the method comprises providing a further known-good layer stack on top of the known-good layer stack. The further known-good layer stack may in particular be an IC substrate or a printed circuit board. The IC substrate and/or the PCB and/or at least one of the layer stacks may be provided with or without one or more embedded or recessed components. Stacking of two known-good layer stacks may be performed once they are both fully finished and tested.

In an embodiment, the method comprises stacking a plurality of component carriers manufactured as described above on top of one another. By taking this measure, even complex systems with sophisticated electronic functionality may be easily formed without the risk that such a complex system lacks functionality due to quality issues with constituents thereof.

In an embodiment, the method comprises, prior to the mounting, testing (in particular electrically testing) the layer stack, the cavity, and the component (in particular individually) for compliance with at least one respective quality criterion (which may be different for each of the layer stack, cavity and component), and classifying the layer stack, the cavity, and the component (in particular individually) as a known-good layer stack, a known-good cavity, or a known-good component. Such a classification of a respective structure (i.e. layer stack, cavity and component) as "known-good" may be made only if the tested layer stack, cavity, or component, meets the at least one assigned quality criterion. Otherwise, it is for instance possible to reject the tested layer stack, cavity, or component, which has not passed the test, as waste.

What concerns the layer stack, the shape and/or dimension of the layer stack may be tested, for instance by optical inspection. Additionally or alternatively, the electronic functionality of the layer stack may be tested, for instance by the application of at least one electric stimulus signal to the electrically conductive contact structure and by the measurement of a corresponding response signal which must for instance fulfill certain conditions (for instance must be within a respective corridor) to allow the layer stack passing the electronic test.

What concerns the cavity, the test may include a detection of shape and/or dimension of the cavity, for instance its deviation from a rectangular cross-section or the width of the cavity. Additionally or alternatively, accessibility of an electrically conductive surface may be tested for the cavity. Also co-planarity and/or bump thickness variation (BTV) may be checked as well.

What concerns the component, the test may be an inspection (for instance by optically monitoring) of shape and/or dimensions of the component. However, it is also possible that the component is tested, additionally or alternatively, in accordance with an electronic functioning test, for instance a chip test.

In an embodiment, the method comprises filling a gap of the cavity between the layer stack and the component with a filling medium (for instance with a dielectric filling medium). Filling may be accomplished, for example, by molding, laminating, dispensing, or printing. For thermal-compression bonding (TCB), non-conductive film (NCF) and non-conductive paste (NCP) may be considered as filling material as well. By filling gaps or recesses between the component and bottom and sidewalls of the cavity in the layer stack with a filling medium during the manufacturing process, it can be ensured that the component is immobilized at a target position within the cavity and also remains there during use and operation of the component carrier. This allows using the component carrier even under harsh conditions in terms of mechanical and/or thermal load. Inserting filling medium in the cavity may be carried out prior, during and/or after mounting the component in the cavity. A corresponding material of the filling medium may for instance be a mold component (such as an epoxy resin), resin material or other previously at least partially uncured material of an electrically insulating layer structure (such as a prepreg foil) flowing into the gaps during lamination of such an electrically insulating layer structure with the pre-formed layer stack, etc.

In an embodiment, the method comprises forming an arrangement of electrically conductive pillars on one main surface of the component carrier, preferably on both opposing main surfaces of the component carrier. In the context of the present application, the term "pillar" may particularly denote a tiny post extending from the component carrier and being oriented preferably substantially perpendicular to a main surface of the component carrier. Such a pillar may be a lengthy structure extending in a pin-like or even spike-like way from the component carrier. In an embodiment, the at least one electrically conductive pillar has an aspect ratio of at least 0.2 (for instance diameter 50 µm, height 10 µm), in particular at least 1.5, preferably at least 2. In particular, the aspect ratio may be in a range between 0.2 and 2. The aspect ratio can be defined as the ratio between a length and a diameter of the pillar.

In particular, the method may comprise mounting at least one of at least one further component (which may also be provided with one or more pillars) and at least one further component carrier (which may also be provided with one or more pillars) on the arrangement of pillars. By providing an arrangement (such as a regular pattern) of protruding pillars on one or both opposing main surfaces of the layer stack, the obtained structure can be advantageously prepared for a three-dimensional integration or stacking of the manufactured component carrier with one or more further component carriers and/or components. If such other component carriers are also provided with corresponding pillars, a pillar-pillar interconnection may be formed, thereby establishing an electric and mechanical coupling between such vertically stacked component carriers. Therefore, the formation of arrangements of pillars strengthens the modular character of the manufactured component carriers being therefore properly appropriate to function as constituents of a more complex system of component carriers.

In an embodiment, the method comprises forming an arrangement of conductive elements (in particular electrically and/or thermally conductive elements) on one main surface of the component. Preferably, such an arrangement is formed on both opposing main surfaces of the component. By equipping one or both opposing main surfaces of the component with an arrangement of conductive elements, both the electric and the thermal performance of the embedded component may be improved. From an electrical point of view, the provision of such an array of conductive elements simplifies the electric connection of the component (such as a semiconductor chip with multiple pads) to the electrically conductive contact structure within the component carrier. Additionally or alternatively, the conductive elements may also serve as thermally conductive elements contributing to the heat removal or heat spreading within the component carrier. This is in particular advantageous when components are integrated which generate significant amount of heat during operation, for instance a microprocessor.

In an embodiment, the method comprises mounting the known-good component on the already formed electrically conductive connection structure in the cavity so as to establish an electrically conductive coupling between the component and the electrically conductive connection structure. By taking this measure, an electric connection and a mechanical connection may be established simultaneously. This renders the manufacturing procedure fast and efficient.

In an embodiment, the method comprises forming the layer stack by connecting (in particular by laminating) a plurality of electrically conductive layer structures forming the electrically conductive connection structure, and a plurality of electrically insulating layer structures. An integral connection between the electrically insulating layer structures and the electrically conductive layer structures may therefore be established by lamination, i.e. the application of heat and/or pressure. In this context, it may be advantageous to form at least part of the electrically insulating layer structures from a material being at least partially uncured prior to the lamination. In the context of the present application, the term "at least partially uncured material" particularly denotes material which has the property to at least partially melt or become flowable by the application of elevated pressure and/or elevated temperature, and become fully hardened or cured (and thereby becomes solid) when releasing or removing the applied elevated pressure and/or decreasing the elevated temperature. Consequently, applying elevated pressure and/or elevated temperature may cause melting of the curable or at least partially uncured material, followed by an irreversible hardening upon releasing the applied high pressure and/or reducing the high temperature. In particular, the "at least partially uncured material" may comprise or consist of B-stage material and/or A-stage material. By providing the layer structure from resin, prepreg, bond film or any other B-stage material, the layer structure may re-melt during lamination so that resin (or the like) may flow for interconnecting the various elements and for closing gaps or voids and may therefore contribute to a stable intrinsic interconnection within the component carrier being manufactured. During lamination, material (such as resin) of the respective electrically insulating layer structure may therefore become flowable or melt, may flow into gaps during cross-linking, and may then re-solidify to thereby form an integral connection between the layer structures.

In an embodiment, the method comprises forming the electrically conductive connection structure for providing an electric coupling both within and perpendicular to a plane corresponding to a respective layer of the stack, i.e. three-dimensionally. Thus, the electrically conductive contact structure may provide electrically conductive traces or bodies both within a respective plane of a respective layer structure of the stack, and perpendicular thereto. By taking this measure, even complex electric connection tasks may be fulfilled by the electrically conductive contact structure.

In an embodiment, the method comprises forming a plurality of component carriers as described above simultaneously on a panel level, and subsequently singularizing the panel to thereby form a plurality of separate component carriers. By manufacturing the component carriers on a panel level rather than individually, an efficient batch procedure may be carried out. In other words, the individual component carriers may be manufactured while still being integrally connected on the panel. For example, such a panel may have a size in a range between 200×200 mm$^2$ up to 600×600 mm$^2$, or even higher. When manufacturing component carriers with embedded components on a panel level, it is of particular advantage to use only known-good structures for this purpose in order to keep the hardware and manufacturing effort as low as possible and increase the yield of the manufacturing process. Singularization may be carried out by separating the obtained processed panel into respective sections each of which comprise part of the layer stack including at least one cavity, and at least one embedded component. For example, singularization may be carried out by laser separation, etching or mechanically sawing the processed panel into the individual component carriers.

In an embodiment, the method comprises testing on a panel level or sub-panel level (in particular electrically testing) a common layer stack, a plurality of cavities, and a plurality of components for compliance with at least one quality criterion. Testing may be done individually for the common layer stack, the individual cavities, and the individual components. The quality criteria for layer stack, cavities and components may be different or the same. The method may further comprise classifying the layer stack, the individual cavities, or the individual components as a known-good layer stack, a known-good cavity, or a known-good component only if the tested layer stack, respective cavity, or respective component meets the respective at least one quality criterion. Otherwise the tested layer stack, respective cavity, or respective component having failed to pass the test may be disregarded or not used for manufacturing the component carriers. Testing the layer stack already at the panel level rather than at a component carrier level may ensure that valuable components such as microprocessors are embedded only in known-good cavities of a known-good portion of a layer stack of the panel. Thus, the yield may be increased and resources may be used efficiently.

In an embodiment, the method comprises covering a top surface of the component mounted in the cavity by a functional structure. For instance, such a functional structure may be a mold body or a heat sink. This provision of a functional structure on top of the component placed in the cavity may further extend the functionality and/or reliability of the obtained component carrier. When adding a mold compound on top of the embedded component, it may be safely prevented from suffering a mechanical load acting on an exterior surface of the component carrier. Also a reliable dielectric isolation of the component may then be ensured. When mounting a heat sink (such as a thermally properly conductive body having multiple cooling fins) directly on the component in the cavity, heat removal during operation of the component carrier may be significantly improved. This reduces the thermal load and the risk of mechanical damage within the component carrier even in the presence of a significant amount of heat generated by the component during operation.

In an embodiment, the method further comprises testing (in particular electrically testing) a plurality of component carriers manufactured as described above, classifying a respective one of the component carriers as known-good component carrier only if the tested respective component carrier meets the at least one quality criterion, otherwise rejecting the respective component carrier, and assembling a system or module composed of a plurality of component carriers which have all been classified as known-good component carriers before assembly. By also testing the manufactured component carriers for compliance with one or more quality criteria prior to connecting several of such component carriers to a module or system, an even more efficient use of hardware and manufacturing resources may be ensured. In other words, it is highly advantageous to carry out a product test not only on the level of the readily manufactured system, but already on a component carrier level.

In an embodiment, the method comprises mounting the known-good component on or to the electrically conductive connection structure without material interface between different materials and without additional different connecting material (such as solder) between component and contact structure. For instance, this may be accomplished advantageously by thermal compression bonding. The term "thermal-compression bonding" or "thermocompression bonding" may in particular denote a bonding technique implementing diffusion bonding, pressure joining, thermocompression welding or solid-state welding. More specifically, two metallic bodies (such as a pad of the component and an exposed area of the electrically conductive contact structure of the layer stack), for instance both comprising or consisting of copper, may be brought into atomic contact applying force and heat simultaneously to thereby form a connection without a bridge between different materials. Without wishing to be bound to a specific theory, it is presently believed that, as a result of an atomic contact between the surfaces, atoms may migrate from one body to the other one sticking the interface together. For instance, a copper-copper connection may be formed at the interface between electrically conductive contact structure and one or more electric contacts of the component. A different material, such as a solder paste or the like, bridging the electrically conductive contact structure and the electric contact of the component may then be advantageously omitted. This prevents undesired effects such as a contact resistance or a mechanical weak point which may suffer from thermal load generated due to different coefficients of thermal expansions of different materials at this interface. Additionally or alternatively, it is possible to implement mass reflow in the manufacturing procedure as well. For appropriate dimensions of the pitch, mass reflow may be used as highly advantageous joining process.

In other embodiments it is however possible to provide such additional materials between electric contact of the component and electrically conductive contact structure, for instance a solder.

In an embodiment, the method comprises forming the electrically conductive connection structure of the stack as a component-external redistribution layer. Correspondingly, the component (in particular a semiconductor chip) may be free of a component-internal redistribution layer and is electrically coupled with the component-external redistribution layer of the layer stack. By taking this measure, a redistribution layer may be formed on the level of component carrier material (i.e. as part of the layer stack) rather than on the level of the component. A redistribution layer may be denoted as a partially conductive and partially dielectric layer structure translating electrically between the small dimensions of the semiconductor world (i.e. the small dimensions of contacts and distances between contacts of the component) and the larger dimensions of the component carrier world (such as larger dimension of electrically conductive traces and distances between adjacent conductive trace elements of a component carrier such as a printed circuit board). Forming a redistribution layer on component carrier level rather than on chip level may simplify the procedure.

In an embodiment, the method comprises forming multiple component carriers simultaneously on two opposing main surfaces of a temporary carrier. Using both opposing main surfaces of a temporary carrier for manufacturing component carriers, in particular on or at a panel level, increases the throughput and the efficiency of the manufacturing process. In this context, a temporary carrier may be a carrier providing mechanical support but not forming part of the readily manufactured component carriers. In contrast to this, a temporary carrier may be disposed, reused or sacrificed during the manufacturing process. For instance, such a temporary carrier may be a core of fully cured component carrier material (such as FR4), a sticky tape (in particular mounted on a carrier body), a glass body (having the advantage of a proper match of the coefficient of thermal expansion), a metal body (having the advantage of a proper dimension stability and being simple in handling), etc.

The manufacturing efficiency may be particularly high when both opposing main surfaces of the temporary carrier are covered with a panel, i.e. when processing of both main surfaces of the temporary carrier is combined with batch processing on a panel level.

In an embodiment, stacks attached to the two opposing main surfaces of the temporary carrier are coreless substrates. Manufacturing component carriers with coreless substrates is highly efficient in terms of material consumption and resulting component carriers with reliable quality. Furthermore, it allows for the use of thin dielectric layers as well, thereby reducing the length of signal carrying conductors or signal length.

The at least one component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, a light guiding element (for example an optical waveguide or a light conductor connection), and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite base structure) or may be a paramagnetic element. However, the component may also be a further component carrier, for example in a board-in-board configuration. The component may be surface mounted on the component carrier and/or may be embedded in an interior thereof. Moreover, also other components may be used as component.

In an embodiment, the layer stack and/or a layer sequence above component and layer stack may comprise of at least one electrically insulating layer structure and/or at least one electrically conductive layer structure. For example, it is possible to form a laminate of the mentioned electrically insulating layer structure(s) and electrically conductive layer structure(s), in particular formed by applying mechanical pressure, and/or if desired, supported by thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a naked die, as example of an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. A printed circuit board may also be flexible and/or stretchable. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming throughholes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene, a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In an embodiment, the component carrier is a laminatetype body. In such an embodiment, the semifinished product or the component carrier is a compound of multiple layer structures which are stacked and connected together by applying a pressing force, if desired accompanied by heat.

DETAILED DESCRIPTION OF ILLUSTRATED EMBODIMENTS

Figure 1:
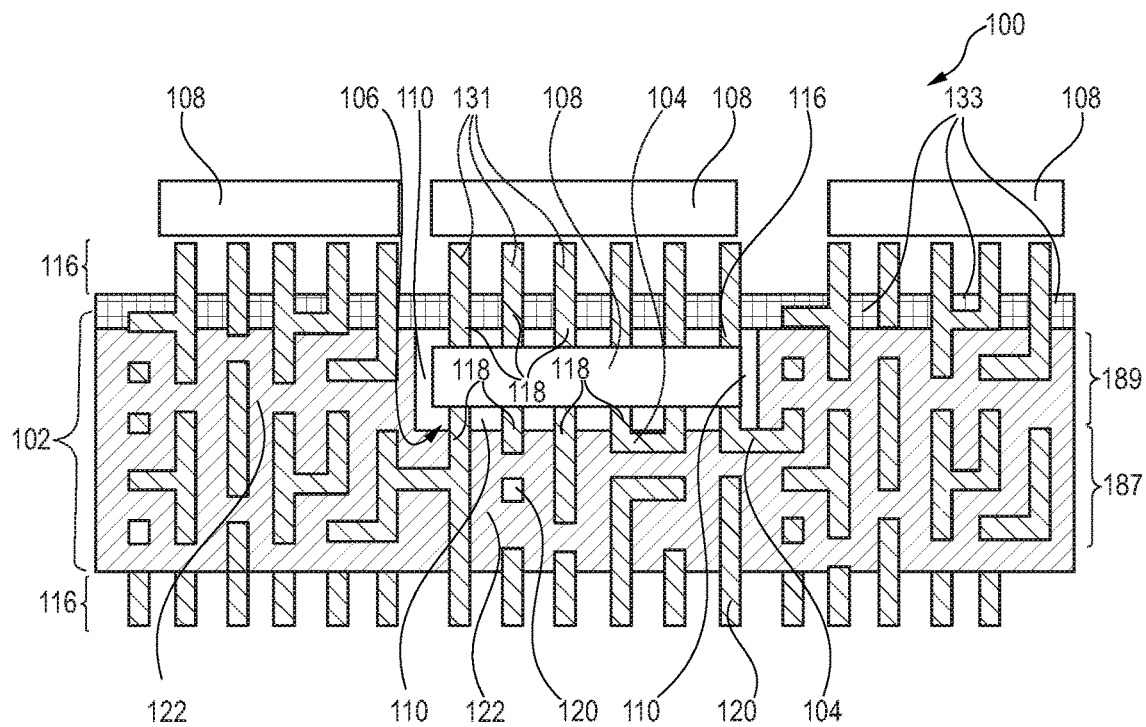
FIG. 1 illustrates a cross-sectional view of a component carrier obtained by performance of a method of manufacturing a component carrier according to an exemplary embodiment of the invention.

The aspects defined above and further aspects of the invention are apparent from the examples of embodiment to be described hereinafter and are explained with reference to these examples of embodiment.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a manufacturing architecture of producing a component carrier in accordance with a chip-last fan-out technology with chip embedding in a known-good layer stack (such as a substrate) is provided. According to an embodiment, a package is provided in which z-axis connections may be realized through a multilayer structure providing interconnections not only constricted along the z-axis, but also in x-direction and y-direction (i.e. within the xy-plane) within each layer along this axis.

Highly advantageously, a known-good component (such as a known-good die) may be placed in a known-good cavity. Preferably, the system or module with the known-good component (for instance known-good die) in the known-good cavity may have one or more other components embedded and/or surface mounted. In particular, an electromechanical combination of known-good modules may be accomplished to form a system arranged from a stack of known-good modules. Highly advantageously, manufacturing and testing of an electrically conductive connection structure as one or more fan-out layers may occur before carrying out the embedding process.

The manufacturing architecture provided according to exemplary embodiments of the invention is advantageous as it may allow for a thickness reduction of the manufactured component carrier, package or system by combining a known-good cavity with a known-good layer stack and embedding of expensive known-good components therein, wherein pre-embedding into a frame is a further advantageous option. For instance, a processor and a memory element (as example for two components) can be placed close to each other in such a component carrier or system. An additional routing capability in the frame area is possible as well. Moreover, a reliable three dimensional stack can be manufactured by a recombination of known-good modules for forming a system. The use of known-good building blocks can increase the yield significantly, since a layer stack or a cavity or a component with insufficient quality in terms of component carrier manufacture can be detected at a very early stage of the manufacturing process. In embodiments of the invention, there is also no need of fan-out layers on components. In contrast to this, fan-out layers may be provided as part of the layer stack. Furthermore, it is possible to use glass reinforced material, which offers high mechanical stability and reliability. Also the implementation of copper layers in a frame (in particular in-plane copper layers in a multilayer configuration) to improve electromagnetic radiation shielding and thermal management is possible.

Exemplary embodiments of the invention hence provide system-in-package like devices. Particularly, exemplary embodiments may be based on a chip-last architecture, where known-good components (in particular semiconductor chips) are assembled in and/or on known-good substrates or PCBs, thereby constituting known-good sub-systems at an early stage of the processing chain. Advantageously, a recombination of such already reliable known-good sub-systems may then the executed in order to obtain a highly reliable full system.

Exemplary applications of embodiments of the invention are highly miniaturized electronic modules for portable devices (for instance smartphones, convertibles, laptops), and processors for servers.

FIG. 1 illustrates a cross-sectional view of a component carrier 100 obtained during performance of a method of manufacturing a component carrier 100 according to an exemplary embodiment of the invention.

The component carrier 100 according to FIG. 1, which is here embodied as a flat plate-shaped printed circuit board (PCB), comprises a laminated known-good layer stack 102 comprising a pre-formed (i.e. formed prior to embedding) electrically conductive connection structure 104 and a component accommodating recess in the layer stack 102 constituting a known-good cavity 106. As can be taken from FIG. 1, the layer stack 102 may be composed of a base body 187 (for instance a printed circuit board or an IC substrate) and one or more interconnect layers 189 above the base body 187. A known-good component 108, for instance a semiconductor chip which has already passed a quality test before embedding, is mounted on and is thereby electrically connected with the already pre-formed electrically conductive connection structure 104 and is accommodated in the cavity 106. Any remaining gap of the cavity 106 between the layer stack 102 and the component 108 may be filled partially or completely with a filling medium 110 for instance a mold or laminate material.

The component carrier 100 comprises electrically conductive layer structures 120 which includes the electrically conductive connection structure 104 beneath the embedded component 108 and may for instance comprise or consist of copper. The layer stack 102 moreover comprises a plurality of electrically insulating layer structures 122 which may be composed of cured resin (such as epoxy resin) and reinforcing particles (such as glass fibers) therein (for instance FR4 material). For forming layer stack 102, the layer structures 120, 122 have been connected by lamination, i.e. the application of pressure and/or heat. Previously at least partially uncured material (for instance uncured resin or prepreg) of the electrically insulating layer structures 122 may be rendered flowable by the application of heat and/or pressure, will consequently start cross-linking and will then re-solidify, thereby integrally connecting the constituents of the layer stack 102.

During the process of manufacturing the component carrier 100 shown in FIG. 1, one or more further components 108 may be surface mounted on an exterior surface of the component carrier 100. It is also possible that one or more further components 108 are embedded in the layer stack 102 and/or at other positions within the component carrier 100. Highly advantageously, an arrangement of pillars 116 is formed at an exterior upper main surface and an exterior lower main surface of the component carrier 100. The arrangement of vertically protruding exposed pillars 116 made of an electrically conductive material such as copper significantly simplifies a three-dimensional integration of the component carrier 100 into a more complex system 150 (see for example FIG. 28). For instance, surface mounted components 108 may be mounted on the pillars 116 (as in FIG. 1) and/or the regular pattern of pillars 116 on both opposing main surfaces of the component carrier 100 may also be used for three-dimensionally stacking multiple component carriers 100 for establishing a system 150 with—via the pillars 116—electrically connected constituents.

Advantageously, it is possible to mount the embedded known-good component 108 during manufacturing on the already formed electrically conductive connection structure 104 in the cavity 106 so as to establish an electrically conductive coupling between the component 108 and the electrically conductive connection structure 104 as a direct consequence of the mechanically mounting process.

As can be taken from FIG. 1, the electrically conductive connection structure 104 integrated in the stack 102 is foreseen for providing an electric coupling both within (see the horizontal plane in FIG. 1) and perpendicular to (see the vertical direction of FIG. 1) a plane corresponding to a respective layer of the stack 102. This renders even complex electric coupling tasks feasible. Descriptively speaking, the electrically conductive connection structure 104 of the stack 102 may constitute a component-external redistribution layer spatially widening up smaller electric coupling dimensions of the chip-type component 108 to the larger electric coupling dimensions of the PCB-type layer stack 102. Correspondingly, a semiconductor chip-type component 108 may be provided free of a component-internal redistribution layer and is electrically coupled with the component-external redistribution layer which may be provided by the layer stack 102.

Advantageously, the known-good component 108 is mounted on the electrically conductive connection structure 104 by thermal compression bonding and hence without a first material to a second material interface at a connection position. In other words, a direct copper-copper bond may be established without any other material therebetween at a mechanical interface between the electrically conductive connection structure 104 and a pad of a (for instance chip-type) component 108. It is however also possible that a solder is used in thermal compression bonding to create an electrical connection. More generally, any mechanical-electrical interconnection technique may be implemented.

The component carrier 100 according to FIG. 1 being configured as a three dimensional package is provided with the arrangement of pillars 116 which may be fabricated on a bottom and/or a top surface of the component carrier 100 when desired for mounting one or more further components 108 and/or mounting the package-type component carrier 100 on a base structure such as a PCB or an IC substrate. Copper interconnections constituting an arrangement of conductive elements 118 may be fabricated on top of the component(s) 108 assembled within the cavity 106 having thermal spreading and/or electric functionality.

Furthermore, electric interconnections in a z-direction (i.e. the vertical direction according to FIG. 1) on the sides of the cavity 106 may be constituted by a multi-layer structure composed of both z- and xy-interconnections (see electrically conductive connection structure 104 and electrically conductive layer structures 120, respectively). This peculiarity allows fanning-out the interconnections from the component(s) 108 within the cavity 106 to the component(s) 108 on top of the component carrier 100 not only in the redistribution layer (RDL) below the cavity 106 provided by the electrically conductive layer structure 104, but also along the z-axis. This architecture will allow the reduction of the overall system dimension in all three dimensions, i.e. less RDLs below the cavity 106 and on top of the package-type component carrier 100.

The component carrier 100 shown in FIG. 1 hence functions as a three-dimensional package. In addition to the component 108 embedded in the layer stack 102, the embodiment of FIG. 1 shows the further components 108 (which may be semiconductor chips as well) being surface-mounted on the pillars 116 of the component carrier 100. More generally, the components 108 may be active components or passive components.

Advantageously, the two of the here altogether four components 108 being arranged directly on top of one another may be interconnected by interconnections 131 corresponding to a subset of the pillars 116, thereby ensuring short current paths and hence a tendency of generating only a moderate amount of heat during operation. Cap layer 133 denotes an uppermost layer structure of the component carrier 100.

Figure 28:
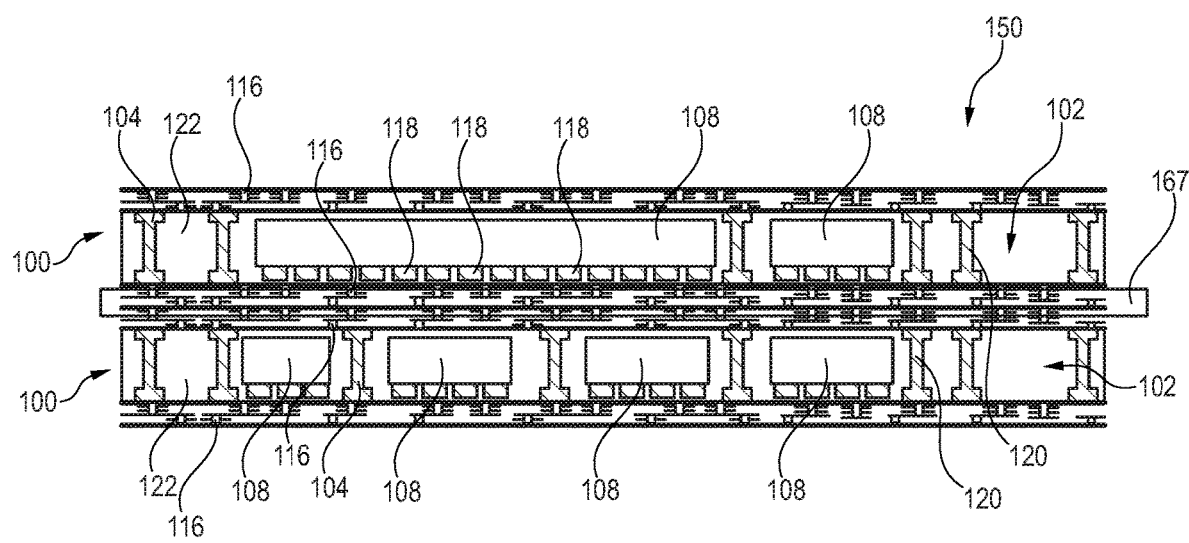
FIG. 28 illustrates a cross-sectional view of a system composed of two stacked and electrically as well as mechanically interconnected component carriers obtained by performing a method of manufacturing the component carriers and the system according to an exemplary embodiment of the invention.

FIG. 1 shows a component carrier 100 being properly appropriate to be used as a modular constituent of a larger system in which the component carrier 100 is stacked with one or more further components 108 (as shown) and/or stacked with at least one further component carrier 100 (not shown in FIG. 1, but for instance possible via the pillars 116, see FIG. 28).

Figure 2:
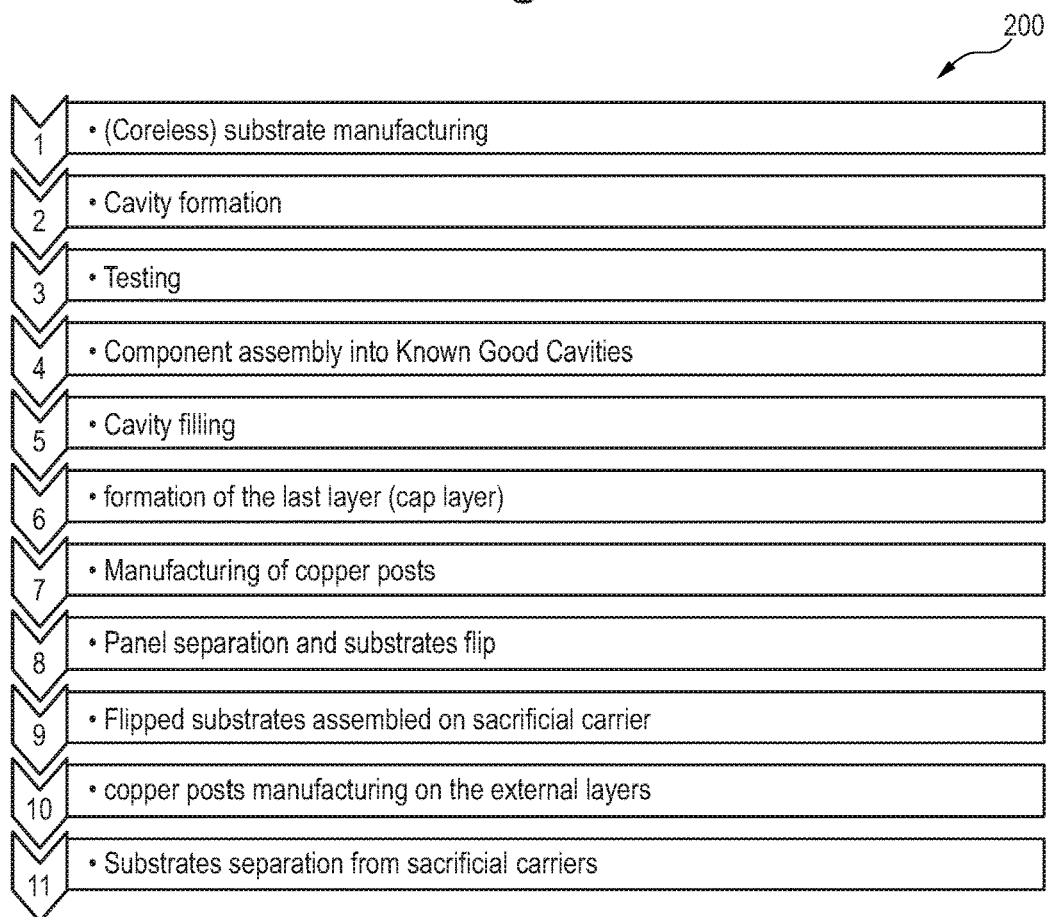
FIG. 2 illustrates a flowchart of procedures to be performed according to a method of manufacturing a component carrier according to an exemplary embodiment of the invention.

FIG. 2 illustrates a flowchart 200 of procedures to be carried out according to a method of manufacturing a component carrier 100 according to an exemplary embodiment of the invention.

The main procedures within the manufacturing process sequence can be summarized as follows.

Procedure 1—Substrate Manufacturing:

In terms of manufacturing a substrate or layer stack 102, z-direction interconnections of the electrically conductive connection structure 104 can be executed using laser via technology, photo-imagable dielectric, etc.

Procedure 2—Formation of Cavity:

The cavity 106 can be manufactured for instance by via laser ablation, or by embedding a release layer with non-adhesive properties relative to component carrier material and thereafter removing a section of the layer stack 102 above the embedded release layer.

Procedure 3—Testing:

In this procedure, testing and selection of known-good layer stacks 102, known-good cavities 106, and known-good components 108 can be performed.

Procedure 4—Assembly of Component(s):

Assembly of known-good components 108 may be executed in known-good cavities 106, and it can be obtained by using ball-grid arrays, thermal compression bonding, etc.

Procedure 5—Filling of the Cavity:

For example, this filling procedure can be executed using one or more of the following methods:

a. Vacuum lamination of a cap layer 133 (to avoid bubbles within the cavity 106). This method may allow combining procedures 5 and 6. Choosing a high flow cap material, the open spaces below the component 108 may also be filled. On the other hand, if for the component assembly, thermal compression bonding-nonconductive film technology (TCB-NCF) is used, it is possible to have the underfilling already provided during assembly. This may give more freedom of choice of the cap layer 133 during vacuum lamination, i.e. a high flow dielectric is then not necessary to fill the open spaces below the component 108 within the cavity 106. It should be mentioned that the cap layer 133 may also have copper structures, in particular to create pillars 116 (for instance above the cavity 106 or on the substrate outside of the cavity 106) connected to the carrier in form of layer stack 102. Furthermore, it is possible that more than one layer is used with copper structures in order to achieve a desired pitch of the pillars 116 on top. Hence, the cap layer 133 may comprise one or more layers composed of insulating and conductive material.

b. Underfilling and cavity filling may be executed by ink-jet technology. Also in this case, if TCB-NCF is used during assembly, the underfilling via ink-jet is not necessary.

c. Thin film assisted molding.

Procedure 6—Formation of Cap Layer:

In case the cap layer 133 is filling the cavity 106 while pressing, then procedures 5 and 6 may be combined to one. On the other hand, in case the cavity 106 is filled using procedure 4b or 4c, then the lamination of a further dielectric cap layer 133 being process compatible may be executed. For the choice of the cap layer 133, in particular the following materials can be used: FR4, Ajinomoto Buildup Film (ABF), etc.

Procedure 7—Formation of Copper Posts on One Side:

This procedure may be carried out at least partly by galvanic deposition of copper material on the layer sequence covered with a patterned photoresist layer, preferably combined with a previous formation of a seed layer by sputtering to produce one or more copper posts 116.

Procedure 8—Panel Separation and Flipping:

The panel may be separated from a sacrificial or temporary carrier 130 (see FIG. 3) and may be flipped.

Procedure 9—Assembly on Further Sacrificial or Temporary Carrier:

The flipped panel may be attached again to a temporary carrier 130.

Procedure 10—Formation of Copper Posts on Other Side:

This procedure may be carried out at least partly by galvanic deposition of copper material on the layer sequence covered with a patterned photoresist layer, preferably combined with a previous formation of a seed layer by sputtering to produce one or more copper posts 116.

Procedure 11—Panel Separation

The panel 124 (see FIG. 3) may be separated from the further sacrificial or temporary carrier 130 and may be singularized into individual component carriers 100.

The manufacturing process shown in FIG. 2 enables the production of component carriers 100 with high efficiency and high yield. A more detailed description of procedures corresponding to procedure 1 to procedure 11 can be taken from FIG. 4 to FIG. 13.

Figure 3:
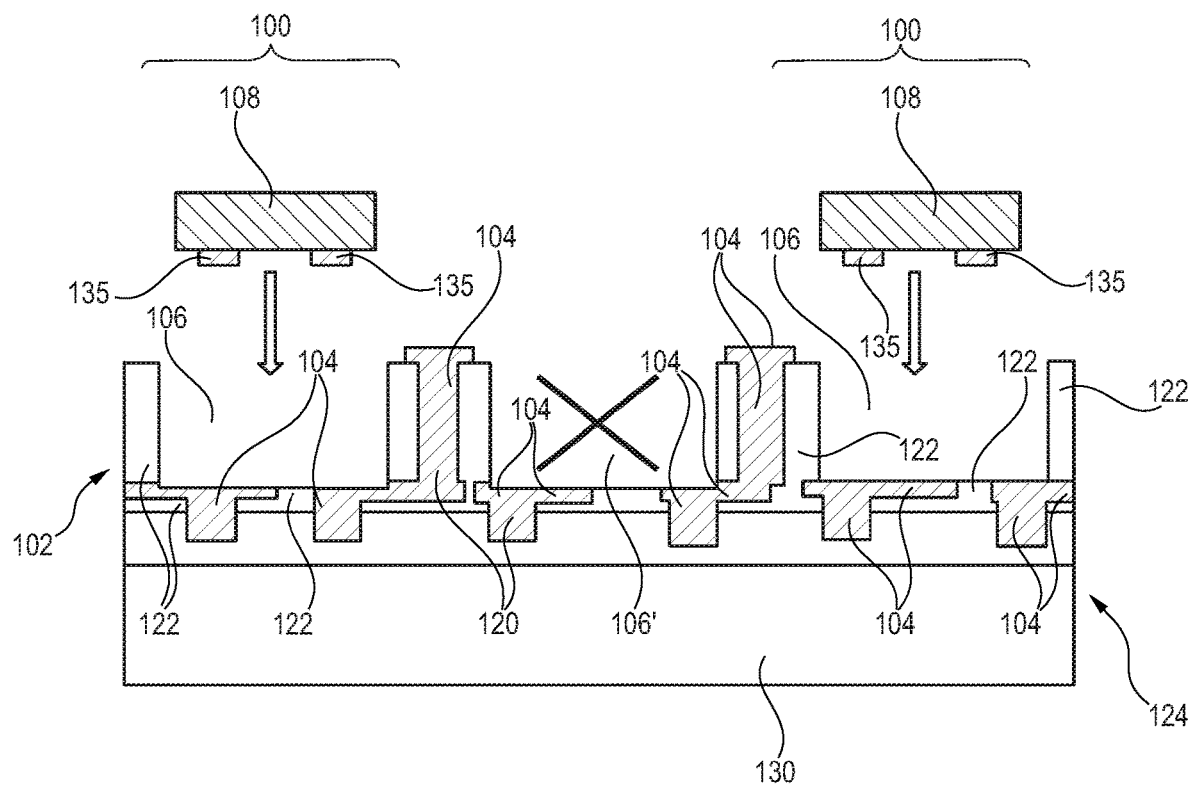
FIG. 3 illustrates a cross-sectional view of a structure obtained during performance of a method of manufacturing a component carrier according to an exemplary embodiment of the invention.

FIG. 3 illustrates a cross-sectional view of a structure obtained during performance of a method of manufacturing a component carrier 100 according to an exemplary embodiment of the invention.

As can be taken from FIG. 3, a plurality of component carriers 100 may be produced simultaneously on or at a panel level in a batch procedure by processing panel 124. At the end of the batch procedure, the panel 124 may be singularized to thereby form a plurality of separate component carriers 100. Testing of layer structures 102, of cavities 106, and/or of readily manufactured component carriers 100 may be carried out at a panel level for compliance with one or more quality criteria (such as whether an electric response to the application of a stimulus signal is within an acceptable range, as to whether a dimension of a respective constituent is in an acceptable range, as to whether a shape of a respective constituent is in an acceptable range, etc.). As a result of this testing, the layer stack 102, the individual cavities 106, and the individual components 108 may be either classified as a known-good layer stack 102, a known-good cavity 106, and a known-good component 108, respectively, if the tested layer stack 102, respective cavity 106, and respective component 108, respectively, separately meet the at least one respective quality criterion.

Otherwise, if the quality test is not passed, the respective tested layer stack 102, tested cavity 106 or tested component 108 is not used for manufacturing the component carriers 100. An example is the not-good cavity 106' in the central portion of FIG. 3 which has failed the quality test. Consequently, the not-good cavity 106' is not used for the manufacturing of component carriers 100 and is therefore not used for assembling a known-good component 108 therein.

For instance, a constituent having failed to pass the test can be supplied to a post processing line for post processing the respective constituent before carrying out the test again, or may be classified or rejected as waste, or may simply be avoided or not used during further manufacturing steps while producing component carriers 100.

The sketch shown in FIG. 3 hence illustrates the assembly process and shows that only known-good cavities 106 are used for placing known-good components 108 therein. Thus, cavities 106, layer stacks 102 and components 108 which have not passed a corresponding quality test will be identified prior to the mounting process and will not be used as constituents for component carriers 100. This increases the electrical and mechanical reliability of the manufactured component carriers 100 and uses resources in terms of material and manufacturing time in a highly efficient way.

FIG. 3 also shows that the components 108 may be provided with chip pads 135 being directly electrically connected to exposed ones of the electrically conductive contact structures 104 of the layer stack 102 during mounting in the cavities 106.

As can be taken from FIG. 3, the production of the component carriers 100 (in particular IC substrates or PCBs) may be efficiently executed on a large format panel 124. During production, the electrical characteristics of the cavities 106 may be tested before the introduction and integration of the component(s) 108 in the cavities 106 is executed. Only those cavities 106 providing or exhibiting acceptable electrical performance, also called known-good cavities 106, may be used to accommodate the tested components 108 which may be called known-good dies. Such a selection on panel production format is shown in FIG. 3.

FIG. 4 to FIG. 13 illustrate cross-sectional views of structures obtained during performance of a method of manufacturing a component carrier 100 according to an exemplary embodiment of the invention. In order to provide a detail description of a method of manufacturing a component carrier 100 according to an exemplary embodiment of the invention, the sketches shown in FIG. 4 to FIG. 13 illustrate the process flow for a corresponding package production. The process of FIG. 4 to FIG. 13 may be carried out on a panel level as well.

Figure 4:
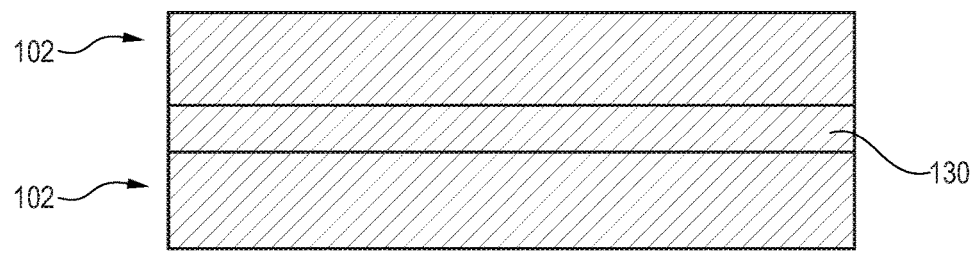
FIG. 4, FIG. 5, FIG. 6, FIG. 7, FIG. 8, FIG. 9, FIG. 10, FIG. 11, FIG. 12 and FIG. 13 illustrate cross-sectional views of structures obtained during performance of a method of manufacturing a component carrier according to an exemplary embodiment of the invention.

Referring to FIG. 4, two known-good layer stacks 102 each comprising an already formed electrically conductive connection structure 104 (not shown in FIG. 4, see for instance FIG. 1 or FIG. 16) is shown. Prior to mounting known-good components 108 in known-good cavities 106 of the known-good layer stacks 102 (see FIG. 5 and FIG. 6), each of the layer stacks 102 is tested for compliance with at least one quality criterion. A respective layer stack 102 can then be classified as a known-good layer stack 102 if the tested layer stack 102 meets the at least one quality criterion, otherwise the tested layer stack 102 may be rejected and may be disregarded for the manufacture of component carriers 100.

In order to render the manufacturing procedure efficient, known-good layer stacks 102 are attached, for instance after being tested, to both opposing main surfaces of a temporary carrier 130 (such as a core, for instance made of FR4 material, a plate, a tape, a metal body, a glass body, etc.) which may also be denoted as a sacrificial carrier. Hence, multiple component carriers 100 are manufactured simultaneously on two opposing main surfaces of the temporary carrier 130, as will be explained in the following figures. In the shown embodiment, the known-good stacks 102 attached to the two opposing main surfaces of the temporary carrier 130 are coreless substrates.

Figure 5:
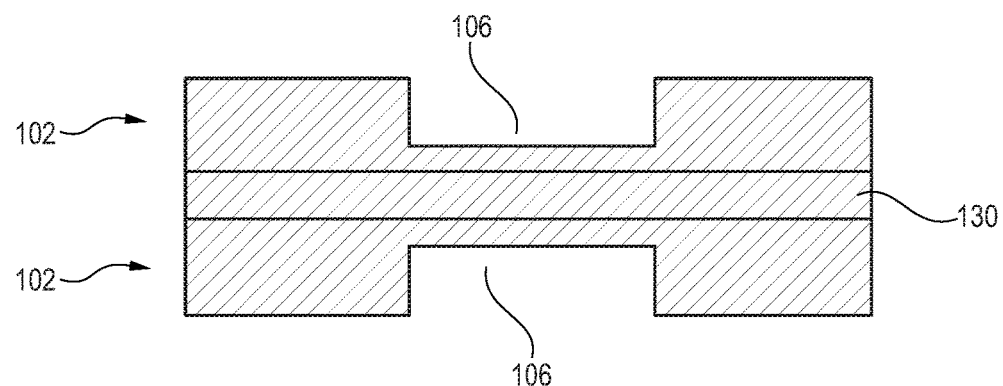

Referring to FIG. 5, cavities 106 are formed as blind holes in exposed surface portions of both known-good layer stacks 102 and are thereafter tested.

FIG. 5 hence shows the result of a cavity formation process carried out with the structure shown in FIG. 4 and resulting in the formation of cavities 106 as blind holes in both opposing layer stacks 102. For instance, cavity formation may be carried out by laser ablation. Alternatively, it is also possible to form the cavities 106 by providing a buried release layer (not shown) in an interior of a respective layer stack 102. Such a release layer may for instance be made of a waxy material and may have the property of intentionally not adhering to adjacent component carrier material of the respective layer stack 102. If such a release layer is embedded in the respective layer stack 102 during a lamination process carried out during formation of the respective layer stack 102, the cavity 106 may be subsequently easily formed by cutting out a portion of the respective layer stack 102 above the release layer. Such a piece can then be simply taken out due to the poor adhesion of the release layer material with regard to adjacent component carrier material to thereby complete formation of the cavities 106.

Still prior to mounting components 108 in the cavities 106 in the layer stacks 102, the method comprises testing the formed cavities 106 for compliance with at least one quality criterion. Thereafter, a respective cavity 106 is classified as a known-good cavity 106 only if the tested cavity 106 meets the at least one quality criterion, otherwise the tested cavity 106 is rejected as waste and is disregarded for the further manufacturing procedure. The two cavities 106 shown in FIG. 5 have turned out as known-good cavities 106 as a result of the test.

Figure 6:
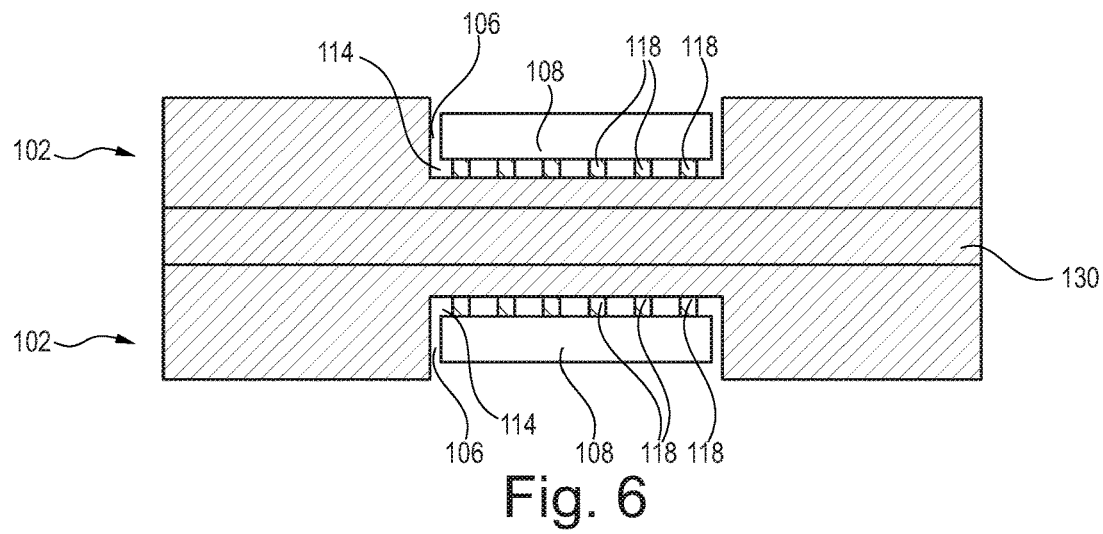

Referring to FIG. 6, the method comprises, still prior to the mounting of the components 108, electrically testing component 108 to be mounted in the known-good cavities 106 for compliance with at least one quality criterion. Only a respective known-good component 108 having passed this test is then mounted on the already formed electrically conductive connection structure 104 in the respective known-good cavity 106 of the respective known-good layer stack 102. In other words, a respective component 108 may be classified as a known-good component 108 only if the tested component 108 meets the at least one quality criterion, otherwise the tested component 108 is rejected and is disregarded for the further manufacturing process.

FIG. 6 therefore shows the result of the placement of the components 108 in the respective cavities 106 so that an electrically conductive connection between the components 108 and the exposed electrically conductive contact structures 104 (not shown in FIG. 6) is established. Gaps 114 remaining between the walls of the cavity 106 on the one hand and the component 108 on the other hand are visible in FIG. 6 as well.

As can be taken from FIG. 6, the method may further comprise optionally forming an arrangement of electrically and/or thermally conductive elements 118 (for instance made of copper) on one main surface of the component 108 arranged in the cavity 106.

Figure 7:
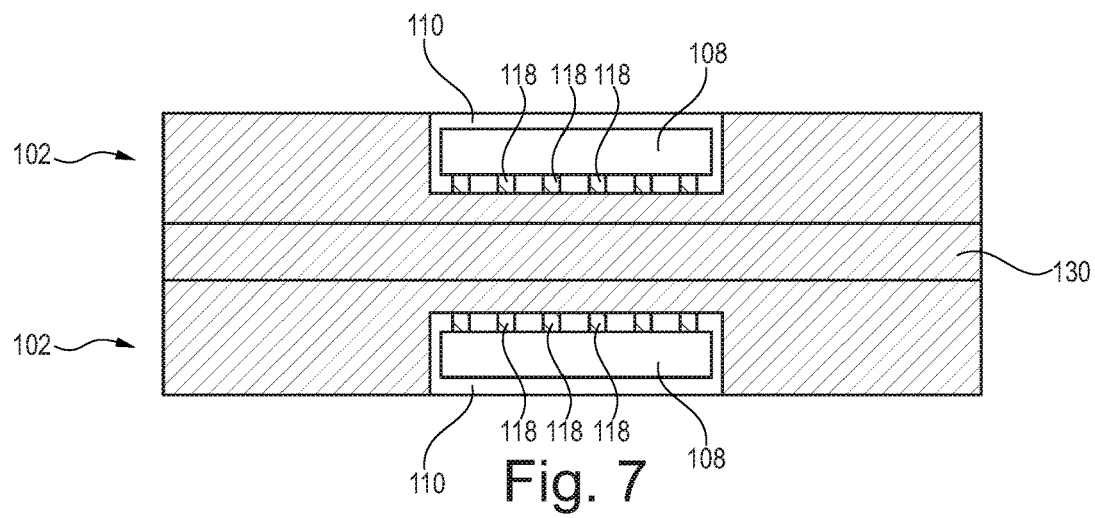

Referring to FIG. 7, the gaps 114 of the cavity 106 between the layer stack 102 and the component 108 may be filled with a filling medium 110, in particular with a dielectric filling medium 110, for instance by molding or laminating. FIG. 7 hence shows that the gaps 114 of the cavity 106 remaining after the placement of the components 108 within the cavity 106 may be filled with the filling medium 110 to thereby fix the components 108 in place. This ensures that the components 108 are arranged at predefined target positions in the cavity 106, thereby increasing registration accuracy of the manufactured component carrier 100.

Figure 8:
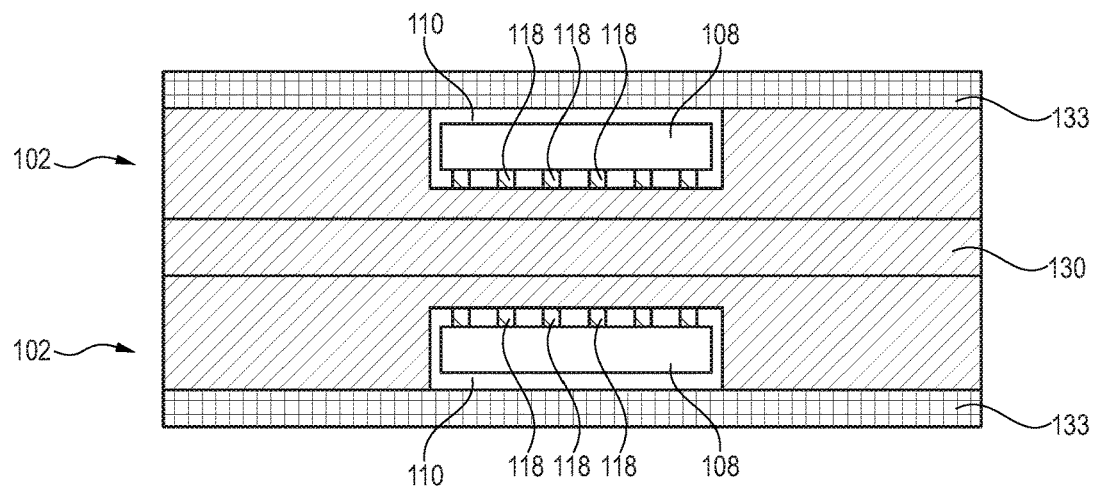

In order to obtain the structure shown in FIG. 8, one or more cap layers 133 may be attached (for instance laminated) on both opposing main surfaces of the structure shown in FIG. 7. For instance, cap layer 133 may be an individual dielectric or electrically conductive layer, or may be a combination of dielectric and electrically conductive structures.

Figure 9:
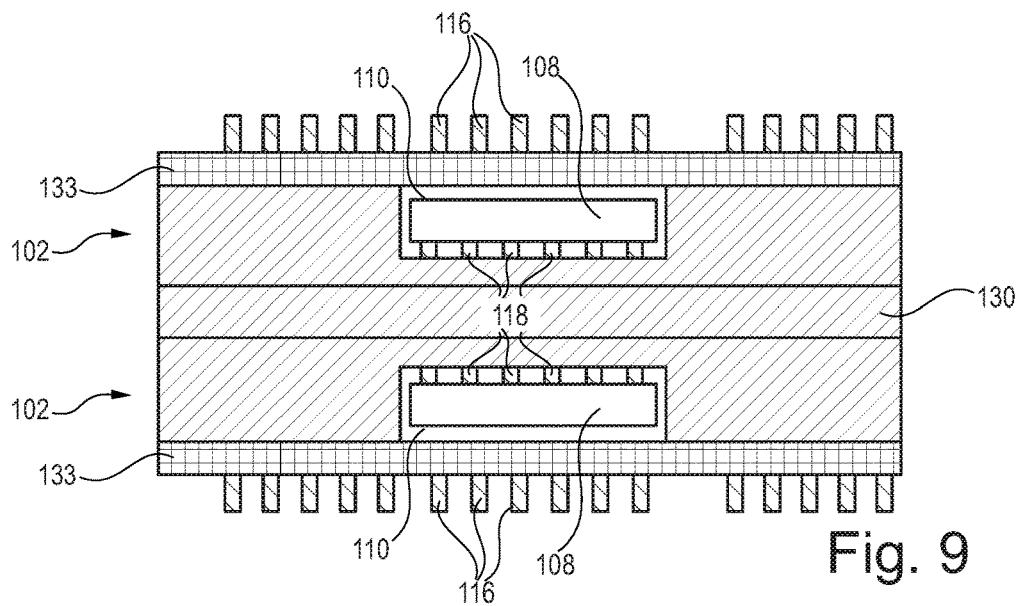

Referring to FIG. 9, an arrangement of electrically conductive pillars 116, for instance made of copper, are formed on one main surface of the respective component carrier 100 to be manufactured. Pillar formation may for instance be accomplished by a galvanic deposition procedure. Optionally, a seed layer or an adhesion promotion layer may be formed prior to forming the pillars 116 by plating. The pillars 116 may protrude beyond the main surfaces of the cap layers 133 to thereby simplify subsequent electric connections of the pillars 116 with other electrically conductive structures.

Figure 10:
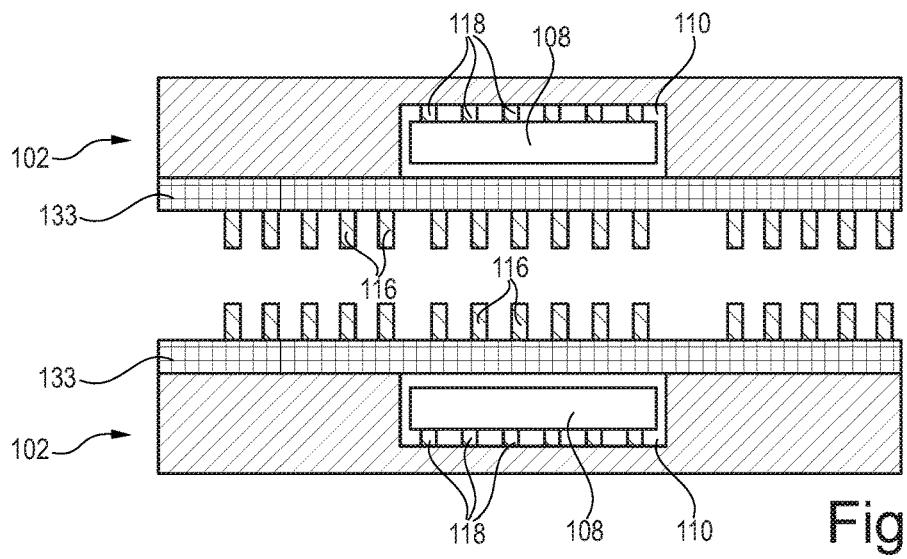

As shown in FIG. 10, the layer structures on the two opposing main surfaces of the temporary carrier 130 may then be delaminated or peeled off. The temporary carrier 130 may be disposed or reused. The delaminated structures may be flipped so that the pillars 116 face each other.

Figure 11:
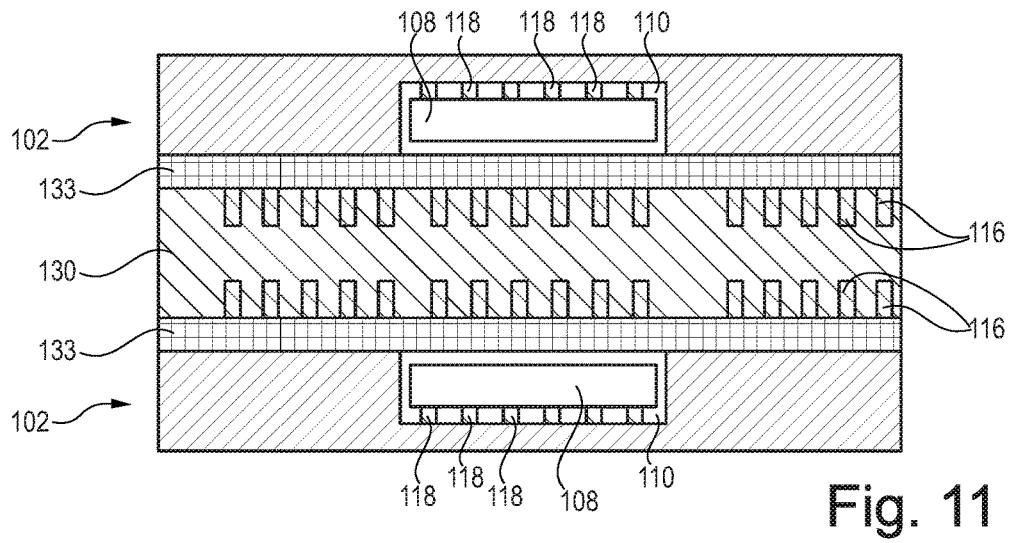

In order to obtain the structure shown in FIG. 11, the flipped structures obtained according to FIG. 10 may then be attached to two opposing main surfaces of a further temporary carrier 130. It is also possible to use the same temporary carrier 130 as before.

Figure 12:
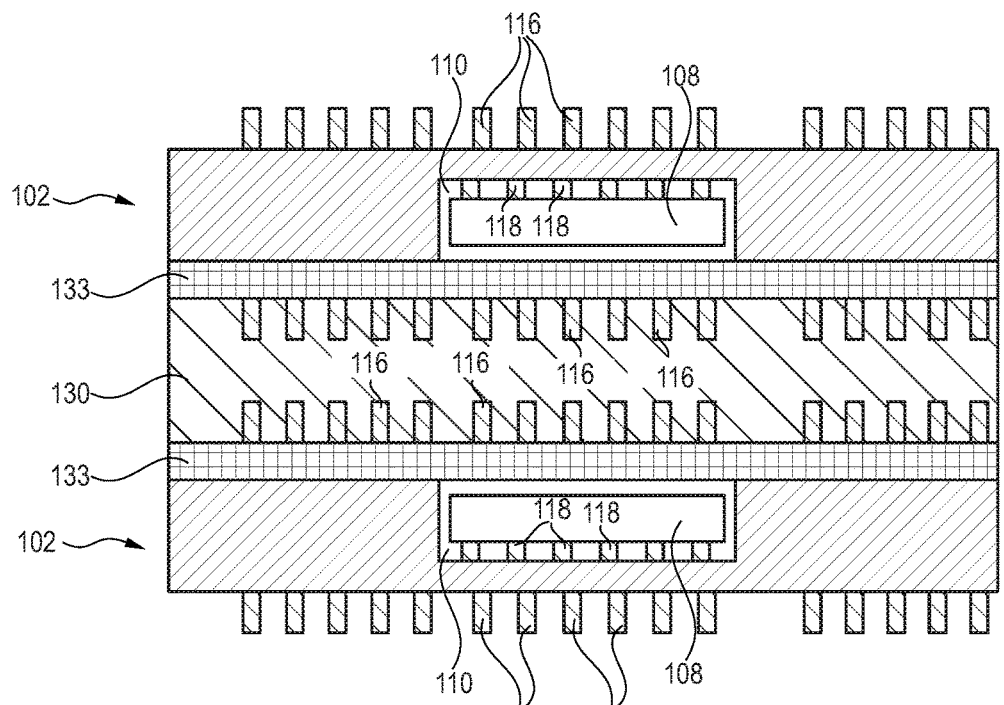

As can be taken from FIG. 12, posts or pillars 116 (preferably made of copper material) may be formed in the same way as before also on the now exposed main surfaces of the respective structure.

Figure 13:
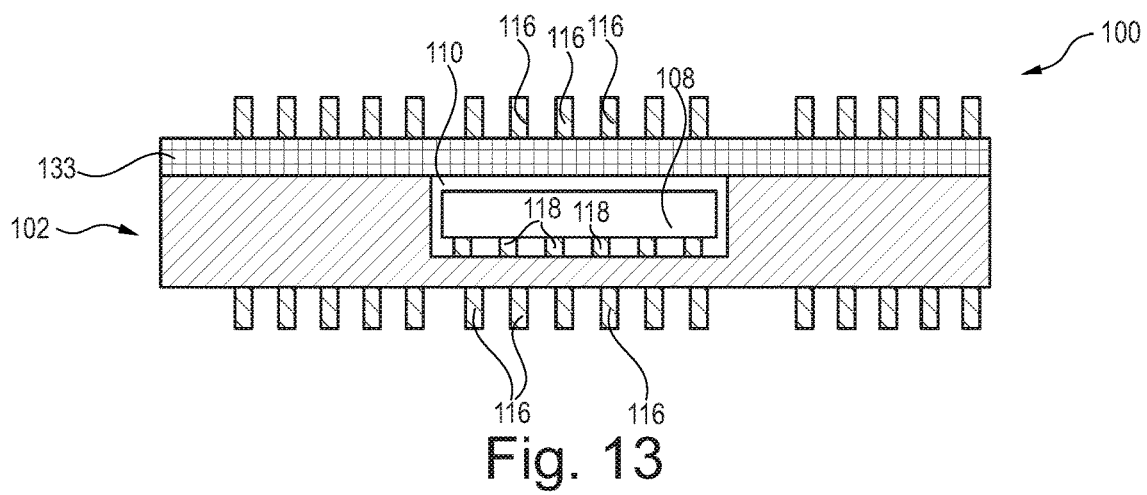

After panel separation and singularization, the component carrier 100 according to an exemplary embodiment and shown in FIG. 13 is obtained. It comprises the exposed pillars 116 on both opposing main surfaces thereof simplifying the use of this component carrier 100 as a constituent for the formation of a more complex system 150 (see FIG. 28) by stacking multiple of such component carriers 100 and/or stacking the component carrier 100 with other constituents during three-dimensional integration. When the manufacturing process according to FIG. 4 to FIG. 13 is performed on a panel level, the individual component carriers 100 may firstly be singularized from the structures formed on the temporary carriers 130.

For the sake of simplicity, the electrically conductive contact structures 104 of the layer stacks 102 which have been formed prior to the mounting of the components 108 in the cavities 106 have been omitted in FIG. 4 to FIG. 13. They are however shown in the following drawings.

FIG. 14 to FIG. 20 illustrate cross-sectional views of structures obtained during performance of a method of manufacturing a component carrier 100 according to another exemplary embodiment of the invention. Another possible process flow is thus reported in FIG. 14 to FIG. 20. In this case the copper pillars 116 are produced first. Afterwards, a coreless substrate process is executed including the copper pillars 116 on top. Subsequently, a cavity 106 is formed and one or more components 108 are assembled uniquely in known-good (in particular electrically) pre-tested cavities 106.

A main difference compared to the previous process flow is that no structures are added in the space above the component 108 within the cavity 106. This may allow the coverage of the component 108 by a functional structure 126, such as a mold (see reference numeral 171) or a heat sink.

Figure 14:
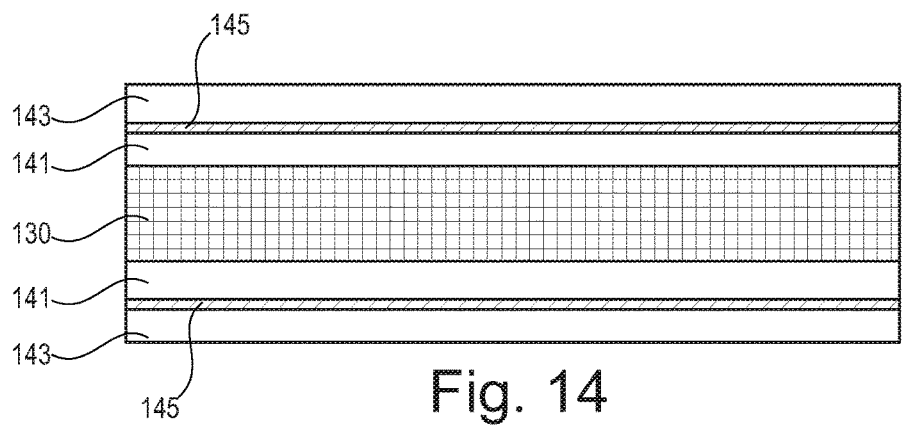
FIG. 14, FIG. 15, FIG. 16, FIG. 17, FIG. 18, FIG. 19 and FIG. 20 illustrate cross-sectional views of structures obtained during performance of a method of manufacturing a component carrier according to another exemplary embodiment of the invention.

As shown in FIG. 14, glue layers 141 are formed on both opposing main surfaces of temporary carrier 130. Resist layers 143 may then be formed on the glue layers 141. Between the respective glue layer 141 and the respective laminated resist layer 143, a seed layer 145 simplifying subsequent formation of copper structures may be arranged.

In order to obtain the layer structure shown in FIG. 15, copper posts or pillars 116 are formed by patterning the laminated resist layers 143 to obtain vias, and by subsequently filling of the vias with copper material.

Figure 15:
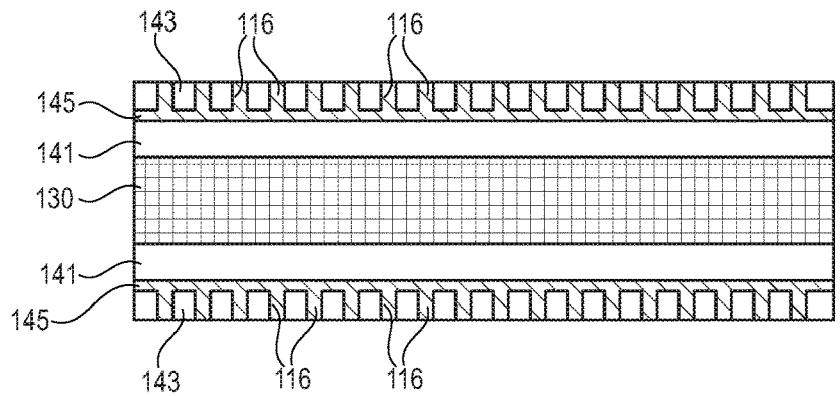
Figure 16:
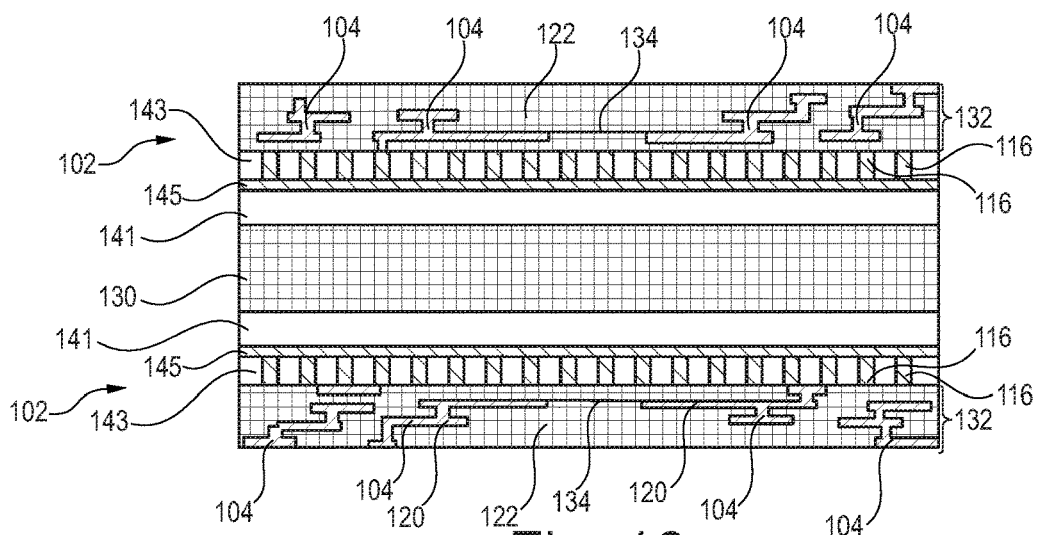

As can be taken from FIG. 16, coreless substrates 132 are formed or are attached as layer structures 102 on both opposing main surfaces of the structure shown in FIG. 15. Optionally, an embedded cavity etch stop layer 134 may be implemented in the coreless substrates 132 for precisely defining the depth of the cavity 106 to be formed.

Figure 17:
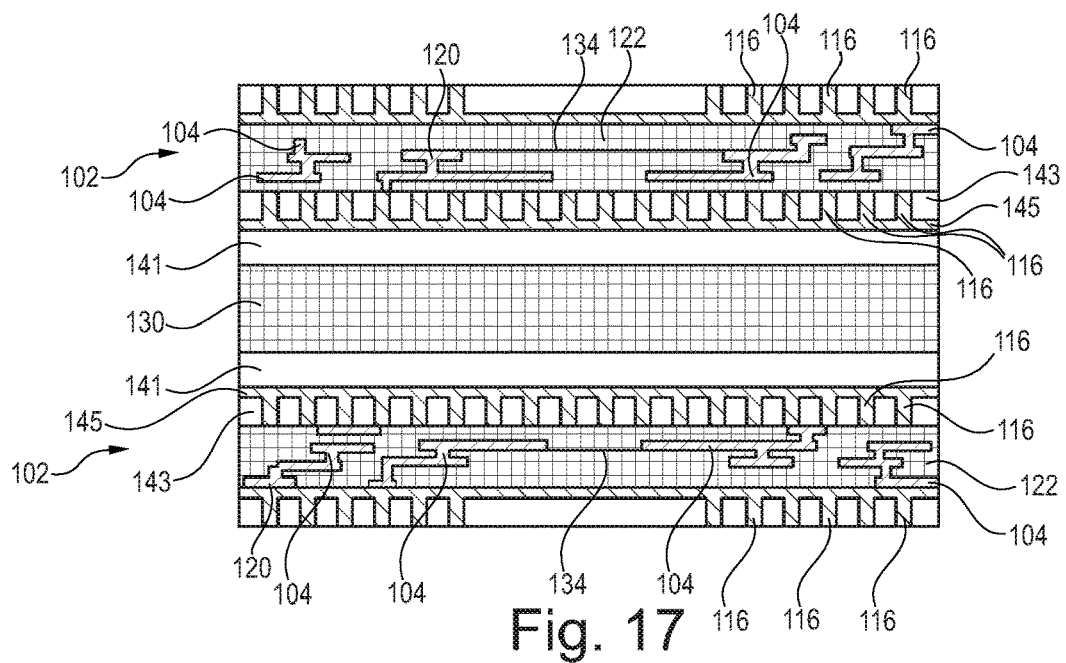

As shown in FIG. 17, copper pillars 116 may also be formed on the exposed surfaces of the structure shown in FIG. 16. Regions in which cavities 106 are formed thereafter are not equipped with pillars 116.

Figure 18:
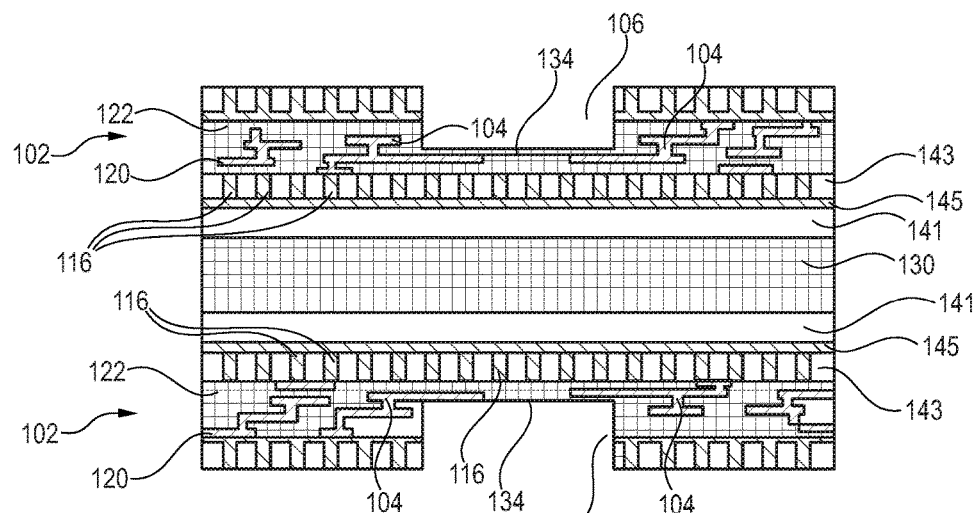

Now referring to FIG. 18, cavities 106 may be next formed in the layer stacks 102. More precisely, this may be accomplished by a resist lamination, patterning, and cavity etch preferably selective to the resist, wherein the etching procedure may stop on the cavity etch stop layer 134 integrated in the respective layer stack 102.

Figure 19:
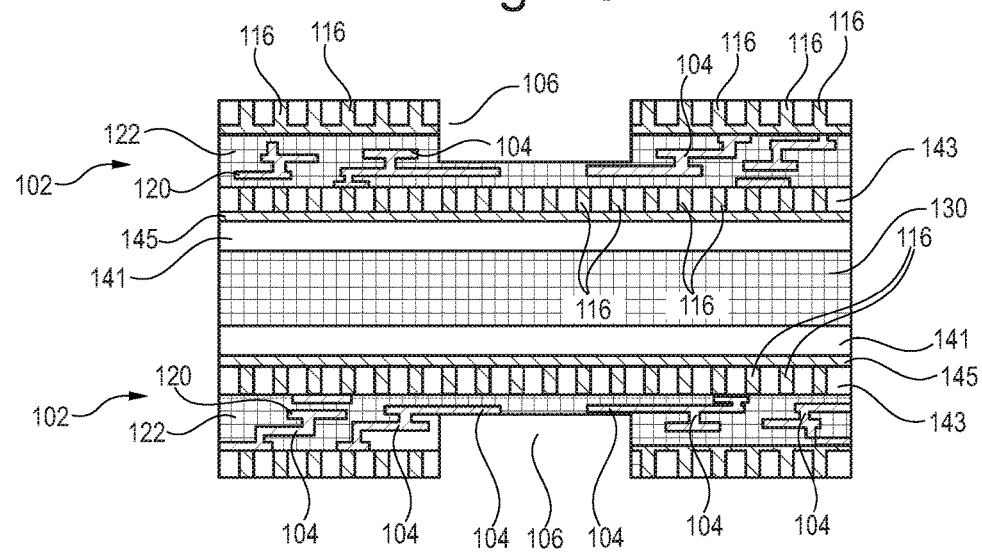

Thereafter, as shown in FIG. 19, the cavity etch stop layer 134 may be stripped. Also the resist may be stripped.

Figure 20:
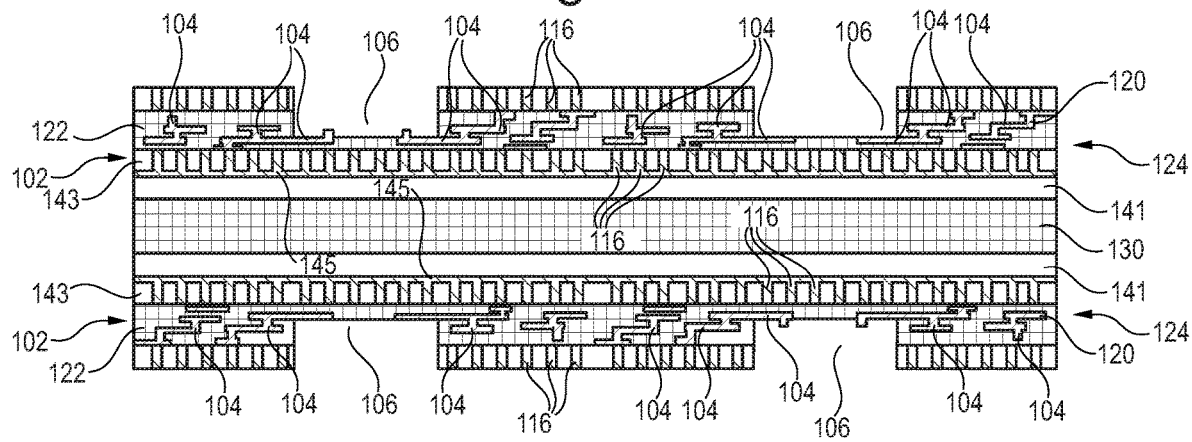

As a result, the structure in FIG. 20 may be obtained which illustrates that the manufacturing process described above referring to FIG. 14 to FIG. 19 may be carried out on a panel level. In other words, the structures attached to the two opposing main surfaces of the temporary carrier 130 may not only comprise constituents of a single component carrier 100 to be manufactured, but may include a large plurality of such component carriers 100 on each main surface. Each of the component carriers 100 may be singularized from the respective panel structure on a respective one of the two opposing main surfaces of the temporary carrier 130 as shown in FIG. 20. In the manufacturing architecture according to FIG. 14 to FIG. 20, the components 108 are assembled in the respective cavities 106 of the structure of FIG. 20 when the substrate manufacturing is complete, including formation of the copper pillars 116. Thereafter, the two processed panels 124 may be removed from the temporary carrier 130 and may be singularized into individual component carriers 100.

FIG. 21 to FIG. 24 illustrate cross-sectional views of structures obtained during performance of a method of manufacturing a respective component carrier 100 according to still other exemplary embodiments of the invention.

Figure 21:
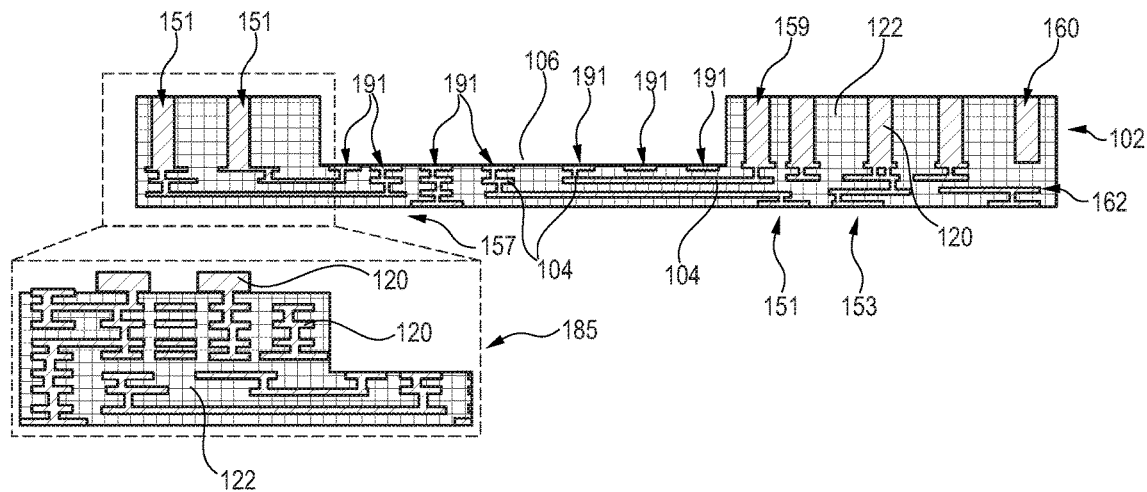
FIG. 21, FIG. 22, FIG. 23 and FIG. 24 illustrate cross-sectional views of structures obtained during performance of methods of manufacturing a respective component carrier according to other exemplary embodiments of the invention.

Referring to FIG. 21, a cross-sectional structure of a portion of a pre-form of a component carrier 100 according to an exemplary embodiment of the invention is shown, in particular showing a region around a cavity 106 in which a known-good component 108 is to be mounted. The electric connections routed from the cavity 106 to an area which is the same and larger than the cavity 106 itself are hereby called "fan-in" and "fan-out" connections, respectively. The vertical connections from the area below to that above of the cavity 106 can be of different kind depending on the functionality required:

a) In case routing is required, then a multi-layer structure may be preferable, including stacked z-vias and xy-tracks. Such a configuration can also be used for providing a heat spreading function.

b) In case shielding of electromagnetic radiation is required it may be sufficient to have only xy metal planes without any structure. In this case, vias isolated from these planes may connect bottom and top of the layer stack 102 and component carrier 100.

FIG. 21 shows details of a component carrier 100 obtained according to such a manufacturing process. As shown, an IC (integrated circuit) substrate or printed circuit board (PCB) with multiple metal layers as electrically conductive contact structure 104 is obtained, including cavity 106 and large vias vertical connections. This enables front side and back side electric contacting. The cavity 106 may be used for embedding one or multiple components 108 (not shown) such as semiconductor chips and/or passive components 108.

Pads 191 are exposed in the bottom of the cavity 106 as part of the electrically conductive contact structure 104, simplifying an electric contacting of the components 108 to be placed in the cavities 106. Optional blind vias may be used to simplify bonding, see reference numeral 160. Reference numeral 151 shows an electric connection between a cavity 106/component 108 and a back side, providing a fan-out function. Reference numeral 157 shows an electric connection between cavity 106/component 108 to the back-side of the component carrier 100 providing a fan-in function. Reference numeral 153 shows a substrate front side to back side electric connection. As indicated by reference numeral 157, it is possible to use the back side for connection purposes of connecting a component 108, cavity formation, etc. Therefore, a fan-in function may be provided. Furthermore, reference numeral 159 denotes large vias for vertical electric connection. Reference numeral 185 shows a detail of a portion of the component carrier 100 illustrating multiple metal layers in a dielectric matrix enabling electric coupling at front side and back side. As indicated by reference numeral 162, metal layer and via stacks may be used for redistribution to enable fan-out and electrical connections.

Figure 22:
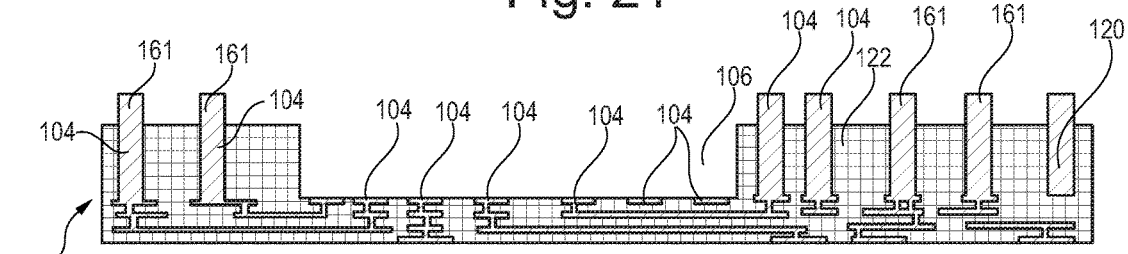
Figure 23:
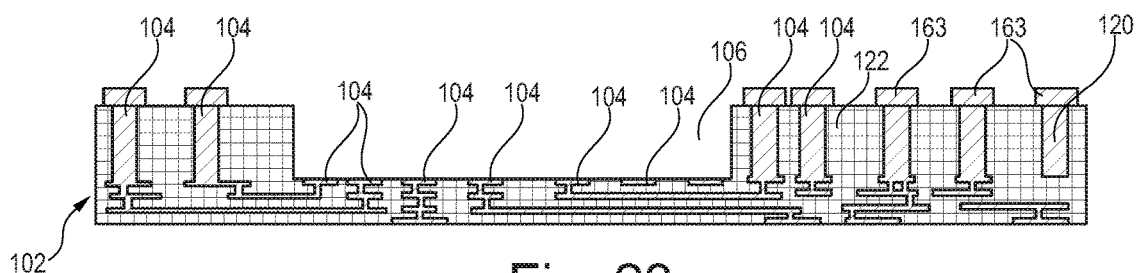
Figure 24:
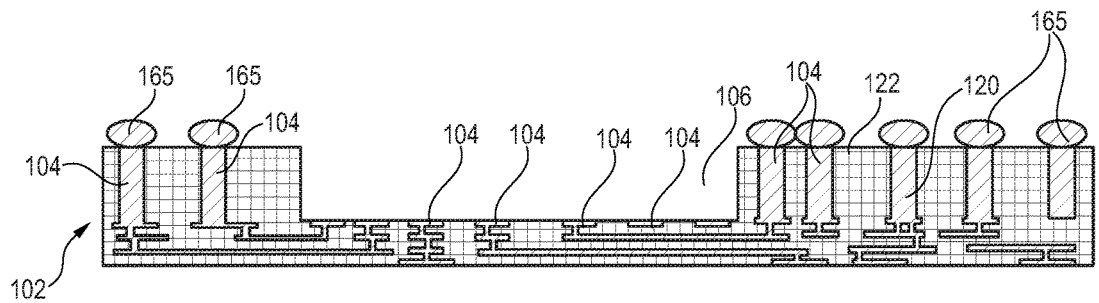

Moreover, the finish on top of a component carrier 100 according to an exemplary embodiment can be of different kinds, as shown in FIG. 22 to FIG. 24.

Now referring to FIG. 22, protruding copper vias are shown and indicated with reference numeral 161. They may be formed for example by adding a further sacrificial layer prior to copper via formation and removal after via copper formation. The protruding vias 161 of FIG. 22 have circular cylindrical shape.

FIG. 23 shows protruding copper pads 163 or pillars which may be formed for example by adding a sacrificial layer prior to copper pad formation and removal after formation.

As shown in FIG. 24, it is also possible to provide bumps 165 with substantially circular or ellipsoidal cross section which may be made of copper material or solder material. These bumps 165 may be formed for example by adding a sacrificial layer prior to the formation of the bumps 165 and which may later be removed after formation of the bumps 165.

Therefore, FIG. 22 to FIG. 24 show different interconnection opportunities on the top layer of the component carrier 100 being manufactured.

Figure 25:
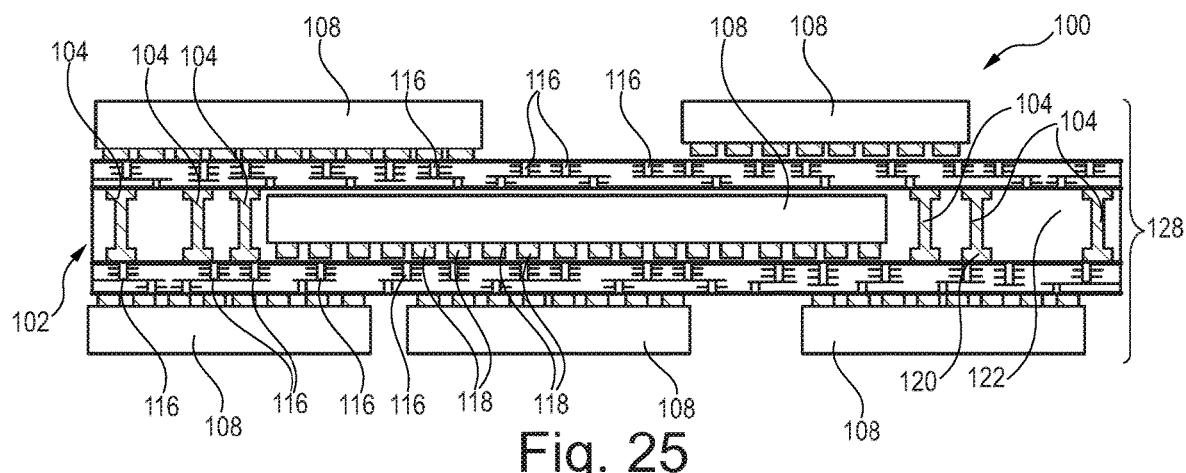
FIG. 25, FIG. 26 and FIG. 27 illustrate cross-sectional views of structures obtained during performance of methods of manufacturing a respective component carrier according to still other exemplary embodiments of the invention.
Figure 26:
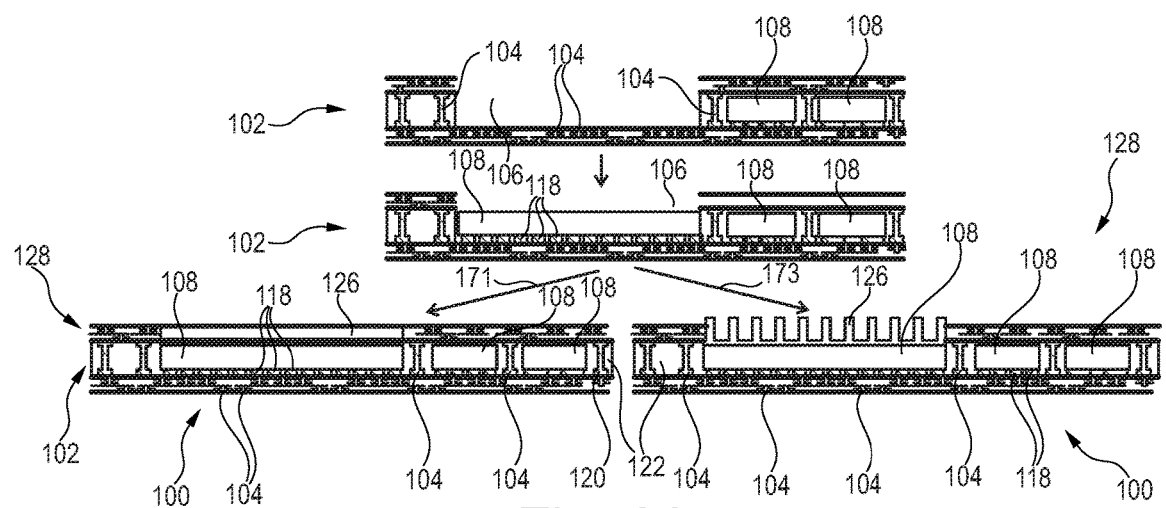
Figure 27:
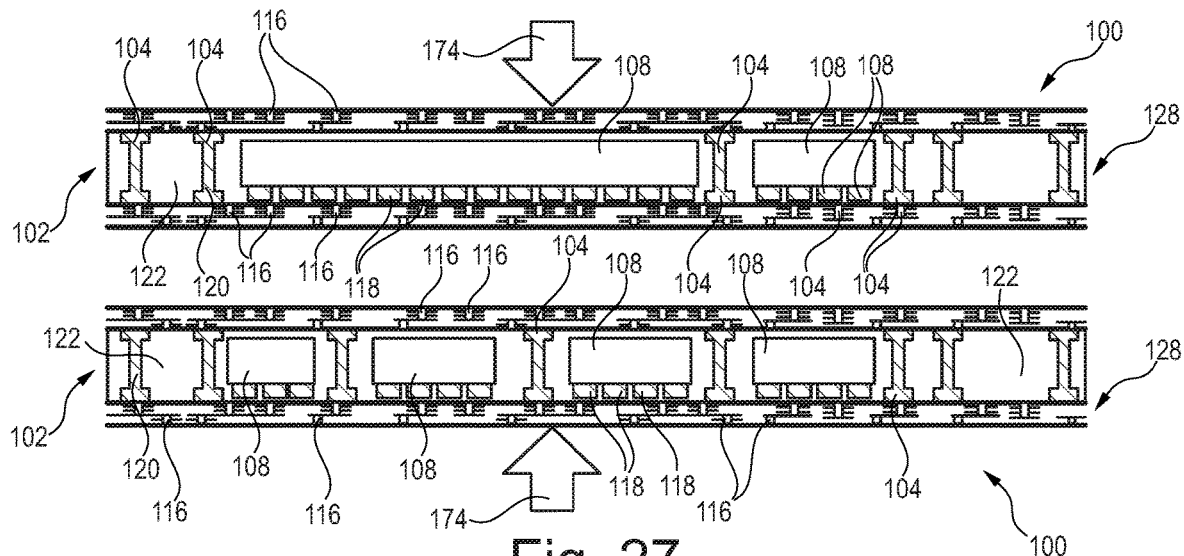

FIG. 25 to FIG. 27 illustrate cross-sectional views of structures obtained during carrying out methods of manufacturing a respective component carrier 100 according to still other exemplary embodiments of the invention.

FIG. 25 shows an example of a component carrier 100 according to an exemplary embodiment of the invention with multiple known-good components 108 being surface-mounted on the respectively exposed pillars 116 and which may be electrically coupled to the electrically conductive contact structure 104 and the embedded component 108. This can be achieved following the process described in FIG. 2, where cap layer 133 may actually comprise more than one routing layer.

In FIG. 25, no copper pillars are shown, although such pillars 116 may be present even in this embodiment, on top and/or on bottom. Reference numeral 194 is indicates routing layers in FIG. 25. Although FIG. 25 to FIG. 28 are shown without copper pillars 116 on the coreless substrate, such electrically conductive pillars 116 may be present on the top and/or the bottom of each of these embodiments.

Referring to FIG. 26, a top surface of the component 108 mounted in the cavity 106 may be covered by a functional structure 126, such as a mold (see reference numeral 171) or a heat sink (see reference numeral 173). Hence, as an alternative to a cap layer 133 of the component(s) 108 assembled into a cavity 106, the top surface of the component 108 may be covered by a mold compound. Further assembly on the component 108 itself can be executed. Another example of such a functional structure 126 on top of the component 108 is a heat sink for promoting heat spreading.

FIG. 26 shows a scheme illustrating assembly of known-good components 108 in known-good cavities 106. The obtained component carrier 100 therefore has one or more known-good components 108 embedded within the respective known-good cavity 106 of a known-good layer stack 102. Furthermore, after component assembly, the upper part of the cavity 106 can be filled at least partially with a dielectric material such as a mold compound or a heat sink may be assembled on top of the component 108 in and/or above the cavity 106.

FIG. 27 illustrates bonding (with pressure, see reference numeral 174) of in this case two component carriers 100 to form an electrical and mechanical connection in between them. For instance, bonding may be accomplished by soldering, copper-copper direct bonding, thermal compression bonding, mass reflow processing, etc. Further methodologies are possible as well, for example, any-layer interstitial via hole (ALIVH), bump interconnect technology ($B^2IT$), etc.

In FIG. 28, a system 150 according to an exemplary embodiment of the invention is shown. The system 150 is composed of two stacked and assembled known-good component carriers 100 and results from the manufacturing method according to FIG. 27. For manufacturing the system 150, two known-good component carriers 100 of FIG. 27 are vertically interconnected. Hence, the individual component carriers 100 are tested before being combined for forming the system 150. Each of the components 100 is composed of a known-good layer stack 102, known-good cavities 106 with known-good components 108 accommodated therein, and comprises a respective electrically conductive connection structure 104 formed prior to the mounting of the components 108 in the cavities 106. Before assembly, each of the component carriers 100 may be individually tested (in particular tested electrically), and may be classified as known-good component carrier 100 only if the tested respective component carrier 100 meets at least one quality criterion. Otherwise, such a component carrier 100 failing the test will be rejected and will not be used as a constituent of the system 150.

The system 150 can then be obtained by mounting the upper known-good component 100 on the lower known-good component 100, whereby a pillar 116-pillar 116-interconnection may be established. More precisely, an electromechanical connection 167 is established between pillars 116 of the component carriers 100, which pillars 116 face each other. By carrying out such a connection technique, it is possible to form the three-dimensionally integrated system 150 according to an exemplary embodiment of the invention shown in FIG. 28.

It should be mentioned that the obtained modules or component carriers 100 as described herein may be a part of the full system 150, which is composed of several modules or component carriers 100. In order to increase the yield it is preferable to re-combine separately manufactured and electrically tested modules (i.e. known-good modules) or component carriers 100 instead of a full monolithic system. The recombination of these known-good modules or component carriers 100 can be executed with technologies such as mass reflow, copper-copper direct bonding, thermal-compression bonding, etc. as shown in FIG. 28.

It should be noted that the term "comprising" does not exclude other elements or steps and the "a" or "an" does not exclude a plurality. Also elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A method of manufacturing multiple component carriers, comprising:
    providing a known-good layer stack including an already formed electrically conductive connection structure and a known-good cavity;
    mounting a known-good component on the already formed electrically conductive connection structure in the known-good cavity;
    wherein prior to the mounting, individually testing a layer stack, a cavity, and a component for compliance with at least one quality criterion, and classifying the layer stack, the cavity, and the component as the known-good layer stack, the known-good cavity, and the known-good component, respectively, when a tested layer stack, a tested cavity, and a tested component, respectively, meet the at least one quality criterion, otherwise rejecting the tested layer stack, the tested cavity, and the tested component, respectively;
    wherein the method further comprises forming multiple component carriers simultaneously on two opposing main surfaces of a temporary carrier on a panel level, wherein the known-good layer stacks are attached to the two opposing main surfaces of the temporary carrier.

2. The method according to claim 1, further comprising:
    providing a further known-good layer stack on top of the known-good layer stack with the known-good component, the further known-good layer stack including a further already formed electrically conductive connection structure and a further known-good cavity;
    mounting a further known-good component on the further already formed electrically conductive connection structure in the further known-good cavity.

3. The method according to claim 1, further comprising:
    providing a further known-good layer stack on top of the known-good layer stack, the further known-good layer stack being an IC substrate or a printed circuit board, with or without one or more embedded or recessed components.

4. The method according to claim 1, further comprising at least one of the following features:
    wherein the method further includes stacking a plurality of component carriers manufactured by providing a known-good layer stack comprising an already formed electrically conductive connection structure and a known-good cavity, mounting a known-good component on the already formed electrically conductive connection structure in the known-good cavity on top of one another;
wherein the method further comprises at least partially filling a gap of the known-good cavity between the known-good layer stack and the known-good component with a dielectric filling medium by one of molding, laminating, dispensing, and printing;
wherein the method further comprises forming an arrangement of electrically conductive pillars on one main surface of the component carrier and mounting at least one of at least one further component and at least one further component carrier on the arrangement of pillars;
wherein the method further comprises forming an arrangement of conductive elements on one main surface of the known-good component;
wherein the method further comprises mounting the known-good component directly on the already formed electrically conductive connection structure in the known-good cavity so as to establish an electrically conductive coupling between the component and the electrically conductive connection structure;
wherein the method further comprises forming the known-good layer stack by connecting at least one electrically conductive layer structure forming the electrically conductive connection structure, and at least one electrically insulating layer structure;
wherein the method further comprises forming the electrically conductive connection structure for providing an electric coupling both within a plane corresponding to a respective layer structure of the known-good layer stack and a direction perpendicular to the plane.

5. The method according to claim 1, wherein the method further comprises:
forming a plurality of component carriers by providing a known-good layer stack including an already formed electrically conductive connection structure and a known-good cavity, mounting a known-good component on the already formed electrically conductive connection structure in the cavity on a panel; and
subsequently singularizing the panel to thereby form a plurality of separate component carriers.

6. The method according to claim 5, wherein the method further comprises:
electrically testing, a common layer stack, a plurality of cavities, and a plurality of components for compliance with at least one quality criterion; and
classifying the common layer stack, the individual cavities, and the individual components as a known-good common layer stack, a known-good cavity, and a known-good component, respectively, when the tested common layer stack, respective cavity, and respective component, respectively, meets the at least one quality criterion, otherwise not using the tested common layer stack, respective cavity, and respective component, respectively, for manufacturing the component carriers.

7. The method according to claim 1, wherein the method further comprises directly covering a top surface of the component mounted in the cavity by a functional structure.

8. The method according to claim 1, wherein the method further comprises:
testing a plurality of component carriers manufactured by providing a known-good layer stack comprising an already formed electrically conductive connection structure and a known-good cavity, mounting a known-good component on the already formed electrically conductive connection structure in the cavity; and
classifying a respective one of the component carriers as known-good component carrier when the tested respective component carrier meets the at least one quality criterion, otherwise rejecting the respective component carrier;
assembling a system composed of a plurality of component carriers classified as known-good component carriers.

9. The method according to claim 1, further comprising at least one of the following features:
wherein the method further comprises mounting the known-good component on the electrically conductive connection structure with or without an interface, for instance solder, between different materials by thermal compression bonding;
wherein the method further comprises forming the electrically conductive connection structure of the stack as a component-external redistribution layer, wherein the known-good component is free of a component-internal redistribution layer and is electrically coupled with the component-external redistribution layer of the electrically conductive connection structure;
wherein stacks attached to the two opposing main surfaces of the temporary carrier are coreless substrates.

10. A method of manufacturing a system, wherein the method comprises:
manufacturing a plurality of component carriers by providing a known-good layer stack comprising an already formed electrically conductive connection structure and a known-good cavity, mounting a known-good component on the already formed electrically conductive connection structure in the known-good cavity,
wherein the method further comprises, prior to the mounting, individually testing a layer stack, a cavity, and a component for compliance with at least one quality criterion, and classifying the layer stack, the cavity, and the component as a known-good layer stack, a known-good cavity, and a known-good component, respectively, when a tested layer stack, a tested cavity, and a tested component, respectively, meet the at least one quality criterion, otherwise rejecting the tested layer stack, cavity, and component, respectively;
wherein the method further comprises forming multiple component carriers simultaneously on two opposing main surfaces of a temporary carrier on a panel level, wherein the known-good layer stacks are attached to the two opposing main surfaces of the temporary carrier;
testing as to whether individual component carriers meet at least one predefined quality criterion, so that a respective component carrier is classified as a known-good component carrier, or is not classified as a known-good component carrier;
assembling a plurality of component carriers which have been classified as known-good component carriers to form the system.

* * * * *